(12) United States Patent
Lee et al.

(10) Patent No.: US 11,869,835 B2
(45) Date of Patent: Jan. 9, 2024

(54) SEMICONDUCTOR PACKAGE

(71) Applicant: Samsung Electronics Co., Ltd., Suwon-si (KR)

(72) Inventors: Seokhyun Lee, Hwaseong-si (KR); Jongyoun Kim, Seoul (KR); Yeonho Jang, Goyang-si (KR); Jaegwon Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/892,215

(22) Filed: Aug. 22, 2022

(65) Prior Publication Data
US 2022/0406702 A1 Dec. 22, 2022

Related U.S. Application Data

(63) Continuation of application No. 16/884,212, filed on May 27, 2020, now Pat. No. 11,456,241.

(30) Foreign Application Priority Data

Oct. 15, 2019 (KR) .................. 10-2019-0127858

(51) Int. Cl.
*H01L 21/00* (2006.01)
*H01L 23/498* (2006.01)
*H01L 21/48* (2006.01)

(52) U.S. Cl.
CPC .... *H01L 23/49838* (2013.01); *H01L 21/4857* (2013.01); *H01L 23/49822* (2013.01); *H01L 23/49816* (2013.01)

(58) Field of Classification Search
CPC ............................................. H01L 23/49838
See application file for complete search history.

(56) References Cited

U.S. PATENT DOCUMENTS

| | | | |
|---|---|---|---|
| 7,632,709 B2 | 12/2009 | Jeon et al. | |
| 8,436,255 B2 | 5/2013 | Goh | |
| 9,922,845 B1 | 3/2018 | Shih | |
| 10,157,823 B2 | 12/2018 | Kim et al. | |
| 10,438,899 B2 | 10/2019 | Kim et al. | |

(Continued)

FOREIGN PATENT DOCUMENTS

| | | |
|---|---|---|
| JP | 2015-035551 A | 2/2015 |
| KR | 10-2008-0105242 A | 12/2008 |

(Continued)

OTHER PUBLICATIONS

Non-Final Office Action dated Dec. 10, 2021 in U.S. Appl. No. 16/884,212.

(Continued)

*Primary Examiner* — Nicholas J Tobergte
(74) *Attorney, Agent, or Firm* — Harness, Dickey & Pierce, P.L.C.

(57) ABSTRACT

A semiconductor package includes a semiconductor chip, a redistribution structure below the semiconductor chip, a first insulating layer below the redistribution structure, a pad below the first insulating layer, the pad being in contact with the redistribution structure, and a bump below the pad, wherein a horizontal maximum length of an upper portion of the pad is greater than a horizontal maximum length of a lower portion of the pad.

20 Claims, 30 Drawing Sheets

(56) References Cited

U.S. PATENT DOCUMENTS

| | | |
|---|---|---|
| 10,872,864 B2 | 12/2020 | Wang et al. |
| 11,456,241 B2 * | 9/2022 | Lee .................... H01L 21/4857 |
| 2003/0178229 A1 | 9/2003 | Toyoda et al. |
| 2011/0254155 A1 | 10/2011 | Lin et al. |
| 2012/0001306 A1 | 1/2012 | Wang et al. |
| 2015/0348892 A1 | 12/2015 | Kuo |
| 2016/0141255 A1 | 5/2016 | Lu et al. |
| 2016/0260659 A1 | 9/2016 | Hsieh et al. |
| 2016/0379915 A1 | 12/2016 | Lee et al. |
| 2017/0301637 A1 | 10/2017 | Huang et al. |
| 2018/0130749 A1 | 5/2018 | Tsai et al. |
| 2019/0027451 A1 | 1/2019 | Kim et al. |
| 2019/0043817 A1 | 2/2019 | Kadade et al. |
| 2019/0122899 A1 | 4/2019 | Kwon et al. |
| 2020/0185314 A1 | 6/2020 | Kim |
| 2020/0388928 A1 | 12/2020 | Lin et al. |
| 2021/0028137 A1 | 1/2021 | Jeon et al. |
| 2021/0098421 A1 | 4/2021 | Wu et al. |

FOREIGN PATENT DOCUMENTS

| | | |
|---|---|---|
| KR | 10-2019-0003403 A | 1/2019 |
| KR | 10-2019-0016338 A | 2/2019 |

OTHER PUBLICATIONS

Final Office Action dated Apr. 4, 2022 in U.S. Appl. No. 16/884,212.
Notice of Allowance dated May 20, 2022 in U.S. Appl. No. 16/884,212.
Official communication dated Mar. 21, 2023 in Korean Application No. 10-2019-0127858.
Written Decision on Registration dated Sep. 23, 2023 in Korean Application No. 10-2019-0127858.

* cited by examiner

SEMICONDUCTOR PACKAGE

CROSS-REFERENCE TO RELATED APPLICATION

This application is a Continuation of U.S. application Ser. No. 16/884,212, filed on May 27, 2020, which claims the benefit of Korean Patent Application No. 10-2019-0127858, filed on Oct. 15, 2019, in the Korean Intellectual Property Office, the disclosures of each of which are incorporated herein in its entirety by reference.

BACKGROUND

The inventive concepts relate to a semiconductor package. More specifically, the inventive concepts relate to a semiconductor package including a redistribution structure.

As smaller-sized and higher-performance electronic devices are required, a reduction in the sizes of semiconductor chips therein would be beneficial. To reduce the size of a semiconductor chip, a redistribution structure (RDS) may be used to connect the semiconductor chip to the outside of a semiconductor package instead of a general printed circuit board (PCB).

SUMMARY

The inventive concepts are directed to providing a semiconductor package with a lower failure rate and improved reliability, and a manufacturing method thereof.

According to an aspect of the inventive concepts, a semiconductor package includes a semiconductor chip, a redistribution structure below the semiconductor chip, a first insulating layer below the redistribution structure, a pad below the first insulating layer, the pad being in contact with the redistribution structure, and a bump below the pad, wherein a horizontal maximum length of an upper portion of the pad is greater than a horizontal maximum length of a lower portion of the pad.

According to another aspect of the inventive concepts, a semiconductor package includes a bump, a pad on the bump, a first insulating layer spaced apart from a lower portion of the pad while in contact with a side surface and an upper surface of an upper portion of the pad, a first conductive pattern including a first line portion on the first insulating layer and a first via portion protruding downward from the first line portion to be in contact with the pad, a second insulating layer on the first insulating layer and the first conductive pattern, a second conductive pattern including a second line portion on the second insulating layer and a second via portion protruding downward from the second line portion to be in contact with the first line portion of the first conductive pattern, and a semiconductor chip electrically connected to the second conductive pattern, wherein a horizontal maximum length of the upper portion of the pad is greater than a horizontal maximum length of the lower portion of the pad.

According to another aspect of the inventive concepts, a semiconductor package includes a package substrate, a first bump below the package substrate, a second bump on the package substrate, an interposer on the second bump, and a first semiconductor chip on the interposer, wherein the interposer includes a pad on the second bump, a first insulating layer on the pad, and a redistribution structure on the first insulating layer, the redistribution layer connecting between the pad and the first semiconductor chip, an upper portion of the pad is located in a first opening in the first insulating layer, and a horizontal maximum length of the upper portion of the pad is greater than a horizontal maximum length of a lower portion of the pad.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

In the present specification, ordinal expressions (e.g., first, second, third, etc.) are used for convenience to distinguish elements having the same name from each other and should not be construed as representing an absolute order. Thus, for example, a component referred to as a fourth insulating layer in a detailed description of the embodiments may be referred to as a second insulating layer in the claims. In addition, for example, a component referred to as a second insulating layer in a first set of claims may be referred to as a third insulating layer in a second set of claims. In addition, for example, a component referred to as a fourth insulating layer in paragraphs of a description of a structure of a semiconductor package according to the inventive concepts with reference to drawings may be referred to as a first insulating layer in a description of a method of manufacturing a semiconductor package according to the inventive concepts with reference to other drawings.

Spatially relative terms, such as "below," "lower," "under," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "lower," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
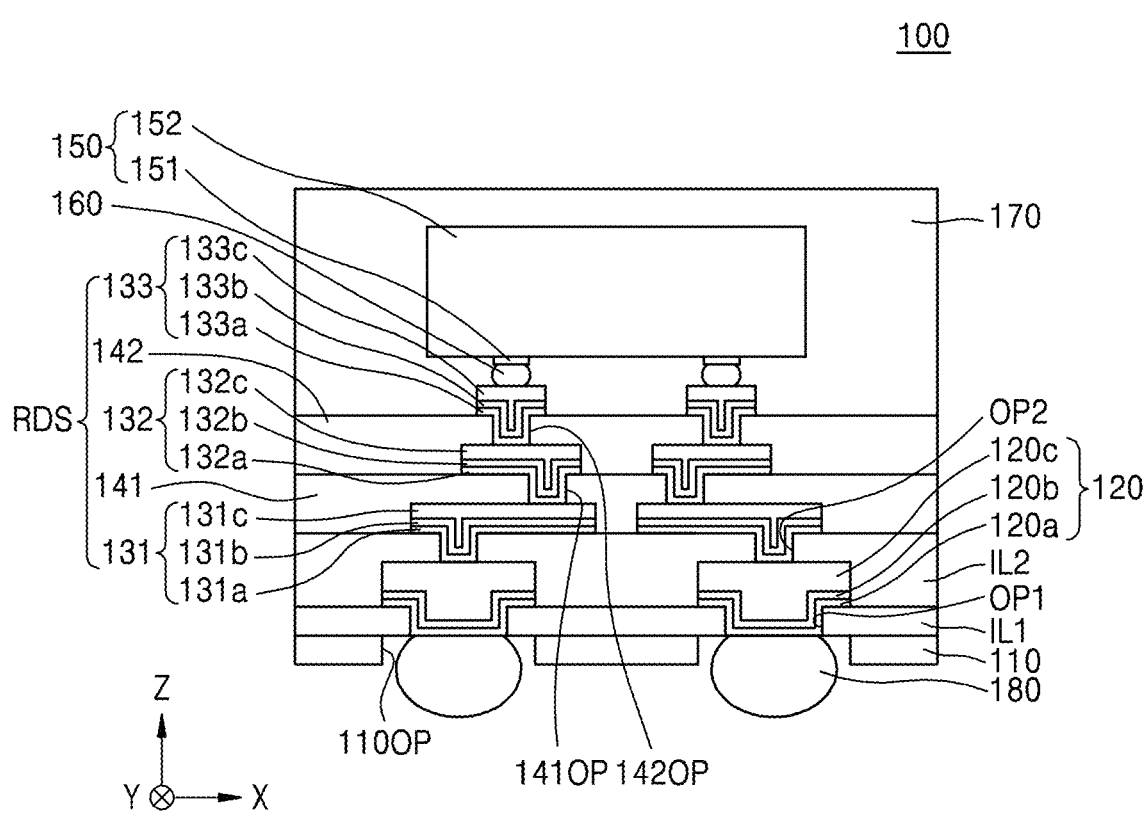
FIG. 1 is a cross-sectional view of a semiconductor package according to an embodiment of the inventive concepts.
Figure 2A:
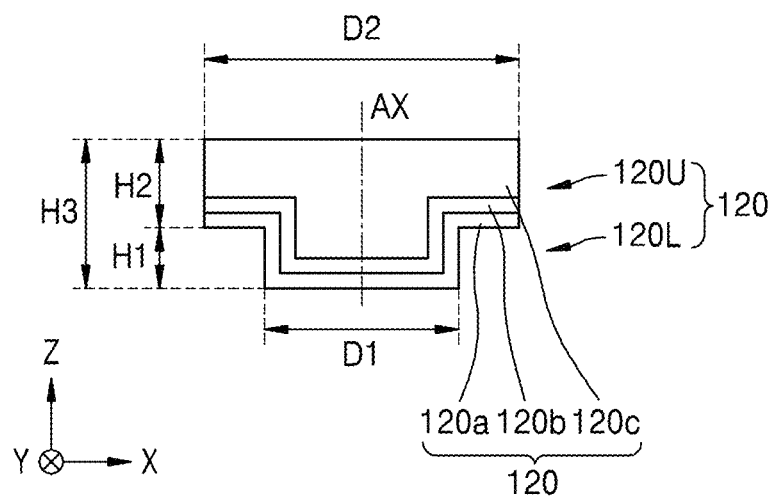
FIGS. 2A and 2B are respectively a cross-sectional view and a bottom view of a pad included in a semiconductor package according to an embodiment of the inventive concepts.
Figure 2B:
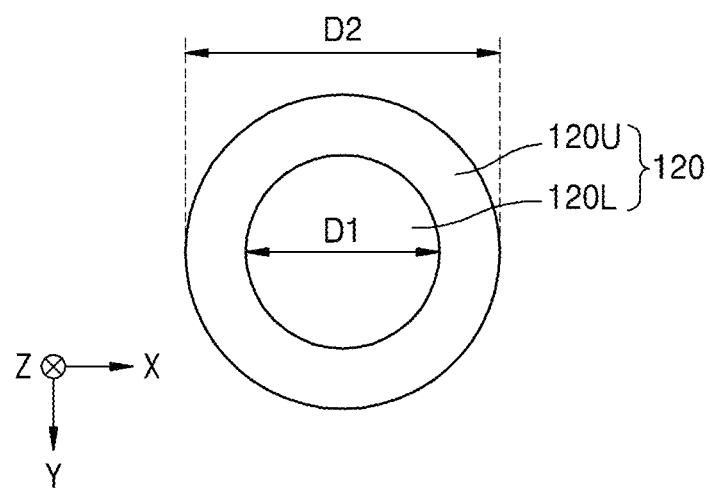
Figure 3A:
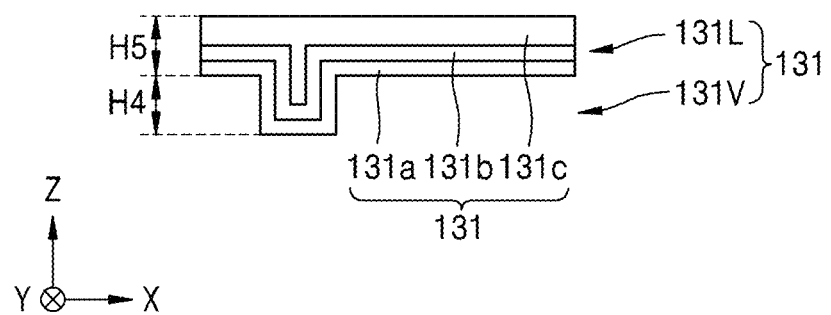
FIGS. 3A and 3B are respectively a cross-sectional view and a bottom view of a conductive pattern included in a redistribution structure included in a semiconductor package according to an embodiment of the inventive concepts.
Figure 3B:
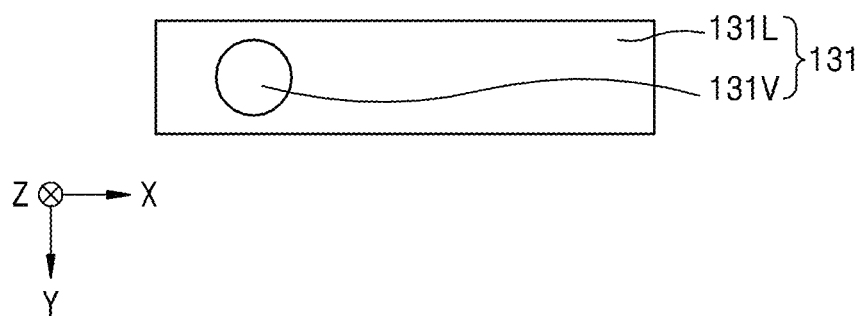

FIG. 1 is a cross-sectional view of a semiconductor package 100 according to an embodiment of the inventive concepts. FIGS. 2A and 2B are respectively a cross-sectional view and a bottom view of a pad 120 included in the semiconductor package 100 according to an embodiment of the inventive concepts. FIGS. 3A and 3B are respectively a cross-sectional view and a bottom view of a conductive pattern 131 included in a redistribution structure RDS included in the semiconductor package 100 according to an embodiment of the inventive concepts.

Referring to FIGS. 1, 2A, 2B, 3A, and 3B, the semiconductor package 100 may include a semiconductor chip 150, a redistribution structure RDS below the semiconductor chip 150, a first insulating layer IL2 below the redistribution structure RDS, the pad 120 located below the first insulating layer IL2 while in contact with the redistribution structure RDS, and a first bump 180 below the pad 120.

The semiconductor chip 150 may include a body 152 and a chip pad 151 on a lower surface of the body 152. The body 152 may include a substrate. The body 152 may include an active surface (the lower side of the body 152 in FIG. 1) and an inactive surface opposite the active surface (an upper surface of the body 152 in FIG. 1). The body 152 may further include an integrated circuit on the active surface.

The substrate may include a semiconductor material, e.g., a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenide (GaAs), indium phosphorus (InP), gallium phosphorus (GaP), indium arsenic (InAs), indium antimony (InSb), indium gallium arsenide (InGaAs), or a combination thereof. The Group II-VI semiconductor material may include, for example, zinc telluride (ZnTe), cadmium sulfide (CdS), or a combination thereof.

The integrated circuit may include a memory circuit, a logic circuit, or a combination thereof. The memory circuit may include, for example, a dynamic random access memory (DRAM) circuit, a static random access memory (SRAM) circuit, a flash memory circuit, an electrically erasable and programmable read-only memory (EEPROM) circuit, a phase-change random access memory (PRAM) circuit, a magnetic random access memory (MRAM) circuit, a resistive random access memory (RRAM) circuit, or a combination thereof. The logic circuit may include, for example, a central processing unit (CPU) circuit, a graphics processing unit (GPU) circuit, a controller circuit, an application specific integrated circuit (ASIC) circuit, an application processor (AP) circuit, or a combination thereof.

The chip pad 151 of the semiconductor chip 150 may be used to electrically connect the semiconductor chip 150 to another element. The chip pad 151 may include a conductive material, like a metal (e.g., copper (Cu), aluminum (Al), silver (Ag), gold (Au), tungsten (W), titanium (Ti)), a doped semiconductive, a conductive organic material (e.g., a conductive polymer), carbon-based material (e.g., carbon nanotubes and graphene), or a combination thereof.

In some embodiments, the semiconductor chip 150 may further include a passivation layer (not shown) covering the lower surface of the body 152 and exposing at least a portion of the chip pad 151. The passivation layer may physically and/or chemically protect the integrated circuit on the active surface of the body 152. The passivation layer may include, for example, an inorganic insulating material such as silicon oxide, silicon nitride, phosphosilicate glass (PSG), borophosphosilicate glass (BPSG), fluorosilicate glass (FSG) or a combination thereof; an organic insulating material such as an insulating polymer; or a combination of the inorganic insulating material and the organic insulating material.

The redistribution structure RDS may be electrically connected to the semiconductor chip 150. In some embodiments, a planar area (e.g., an area of a cross-section perpendicular to a Z axis) of the redistribution structure RDS may be larger than that of the semiconductor chip 150. For example, the semiconductor package 100 may be a fan-out wafer-level package. However, in another embodiment, unlike that illustrated in FIG. 1, the planar area of the redistribution structure RDS may be the same as that of the semiconductor chip 150. For example, the semiconductor package 100 may be a fan-in wafer-level package.

The redistribution structure RDS may include a plurality of insulating layers, for example, second and third insulating layers 141 and 142, and a plurality of conductive patterns for example, first, second, and third conductive patterns 131 to 133. For example, the redistribution structure RDS may include the second insulating layer 141, the third insulating layer 142 on the second insulating layer 141, the first conductive pattern 131 below the second insulating layer 141, the second conductive pattern 132 between the second insulating layer 141 and the third insulating layer 142, and the third conductive pattern 133 on the third insulating layer 142. Although FIG. 1 illustrates that the redistribution structure RDS includes the two insulating layers 141 and 142 and the three conductive patterns 131 to 133, the number of insulating layers and conductive patterns included in the redistribution structure RDS may be lesser or greater.

The first to third conductive patterns 131 to 133 of the redistribution structure RDS may electrically connect the pad 120 below the redistribution structure RDS to the chip pad 151 of the semiconductor chip 150. For example, the first conductive pattern 131 may be in contact with the pad 120. The second insulating layer 141 may be located on the first conductive pattern 131 and include a second opening 141OP exposing a portion of the first conductive pattern 131. The second conductive pattern 132 may be provided on the second insulating layer 141 and be in contact with the first conductive pattern 131 via the second opening 141OP of the second insulating layer 141. The third insulating layer 142 may be located on the second conductive pattern 132 and include a third opening 142OP exposing a portion of the second conductive pattern 132. The third conductive pattern 133 may be located on the third insulating layer 142 and be in contact with the second conductive pattern 132 via the third opening 142OP of the third insulating layer 142. The chip pad 151 of the semiconductor chip 150 may be connected to the third conductive pattern 133.

The first conductive pattern 131 may include a first line portion 131L, and a first via portion 131V protruding downward (in a —Z-axis direction) from the first line portion 131L to be in contact with the pad 120. In some embodiments, a thickness H5 of the first line portion 131L of the first conductive pattern 131 may be in a range from about 3 μm to about 5 μm. In some embodiments, a thickness H4 of the first via portion 131V of the first conductive pattern 131 may be in a range from about 3 μm to about 10 μm. In some embodiments, the first line portion 131L of the first conductive pattern 131 may have a tetragonal shape and the first via portion 131V of the first conductive pattern 131 may have a cylindrical shape, but in another embodiment, the first line portion 131L and the first via portion 131V of the first conductive pattern 131 may have different shapes. For example, the first via portion 131V of the first conductive pattern 131 may have a square pillar shape, and the first line portion 131L of the first conductive pattern 131 may have a shape in which a plurality of polygons (e.g., quadrangles) connect to each other in a plan view.

Similarly, the second conductive pattern 132 may include a second line portion on the second insulating layer 141, and a second via portion protruding downward (in the Z-axis direction) from the second line portion and extending via the second opening 141OP of the second insulating layer 141 to contact with the first line portion 131L of the first conductive pattern 131. Similarly, the third conductive pattern 133 may include a third line portion on the third insulating layer 142, and a third via portion protruding downward (in the Z-axis direction) from the third line portion and extending via the third opening 142OP of the third insulating layer 142 to contact with the second line portion of the second conductive pattern 132.

In some embodiments, the first conductive pattern 131 may include a first barrier layer 131a, a first seed layer 131b, and a first filling layer 131c, which are sequentially stacked on the first insulating layer IL2. However, unlike the illustration in FIG. 1, a boundary between the first barrier layer 131a and the first seed layer 131b and a boundary between the first seed layer 131b and the first filling layer 131c may not be clear and/or well defined in profile. Similarly, the second conductive pattern 132 may include a second barrier layer 132a, a second seed layer 132b, and a second filling layer 132c which are sequentially stacked on the second insulating layer 141. Similarly, unlike the illustration in FIG. 1, a boundary between the second barrier layer 132a and the second seed layer 132b and a boundary between the second seed layer 132b and the second filling layer 132c may not be clear and/or well defined in profile. Similarly, the third conductive pattern 133 may include a third barrier layer 133a, a third seed layer 133b, and a third filling layer 133c, which are sequentially stacked on the third insulating layer 142. Similarly, unlike the illustration in FIG. 1, a boundary between the third barrier layer 133a and the third seed layer 133b and a boundary between the third seed layer 133b and the third filling layer 133c may not be clear and/or well defined in profile.

The second and third insulating layers 141 and 142 of the redistribution structure RDS may include, for example, an inorganic insulating material such as silicon oxide, silicon nitride, PSG, BPSG, FSG, or a combination thereof; an organic insulating material such as an insulating polymer; or a combination of an inorganic insulating material and an organic insulating material. In some embodiments, the second and third insulating layers 141 and 142 may be formed from a photoimageable dielectric (PID) material. When the second and third insulating layers 141 and 142 are formed from the PID material, the second and third openings 141OP and 142OP may be easily formed in the second and third insulating layers 141 and 142.

The first to third filling layers 131c to 133c of the first to third conductive patterns 131 to 133 of the redistribution structure RDS may include a conductive material, for example, a metal (e.g., copper (Cu), aluminum (Al), silver (Ag), gold (Au), tungsten (W), titanium (Ti)), a doped semiconductive, a conductive organic material (e.g., a conductive polymer), carbon-based material (e.g., carbon nanotubes and graphene), or a combination thereof. The first to third seed layers 131b to 133b of the first to third conductive patterns 131 to 133 of the redistribution structure RDS may include the same material as the first, second, and third filling layers 131c, 132c, and 133c. The first to third barrier layers 131a to 133a of the first to third conductive patterns 131 to 133 of the redistribution structure RDS may include titanium (Ti), tantalum (Ta), titanium nitride (TiN), tantalum nitride (TaN), or a combination thereof.

In some embodiments, the semiconductor package 100 may further include a second bump 160 between the chip pad 151 of the semiconductor chip 150 and the third conductive pattern 133 of the redistribution structure RDS. The second bump 160 may be in contact with the chip pad 151 of the semiconductor chip 150 and the third conductive pattern 133 of the redistribution structure RDS, and may electrically connect the semiconductor chip 150 and the redistribution structure RDS. The second bump 160 may include, for example, a metal such as tin (Sn), lead (Pb), silver (Ag), copper (Cu), bismuth (Bi), indium (In), zinc (Zn), antimony (Sb) or a combination thereof. In some embodiments, the second bump 160 may be formed from a solder ball. In some embodiments, the semiconductor package 100 may further include an underfill or a chip adhesive layer (not shown) located between the semiconductor chip 150 and the redistribution structure RDS and surrounding the second bump 160.

The first insulating layer IL2 may be located below the second insulating layer 141 of the redistribution structure RDS. The first insulating layer IL2 may include a first opening OP2 exposing a portion of the pad 120. The first conductive pattern 131 of the redistribution structure RDS may include a first line portion 131L on the first insulating layer IL2 and a first via portion 131V protruding downward from the first line portion 131L (in the Z-axis direction) and extending via the first opening OP2 of the first insulating layer IL2 to be in contact with the pad 120. The first insulating layer IL2 may include, for example, an inorganic insulating material such as silicon oxide, silicon nitride, PSG, BPSG, FSG, or a combination thereof; an organic insulating material such as an insulating polymer; or a combination of an inorganic insulating material and an organic insulating material. In some embodiments, the first insulating layer IL2 may be formed from the PID material.

The pad 120 may be an under bump metal (UBM). The pad 120 may include an upper portion 120U in contact with the first conductive pattern 131 of the redistribution structure RDS, and a lower portion 120L in contact with the first bump 180. A horizontal maximum length D2 of the upper portion 120U of the pad 120 may be greater than a horizontal maximum length D1 of the lower portion 120L of the pad 120. In some embodiments, the horizontal maximum length D2 of the upper portion 120U of the pad 120 may be in a range from about 50 μm to about 300 μm. In some embodiments, a total thickness H3 of the pad 120 may be in a range from about 6 μm to about 20 μm, for example between about 6 μm to about 13 μm. In some embodiments, a thickness H1 of the lower portion 120L of the pad 120 may be in a range from about 3 μm to about 10 μm. In some embodiments, a thickness H2 of the upper portion 120U of the pad 120 may be in a range from about 3 μm to about 10 μm.

In some embodiments, each of the upper portion 120U and the lower portion 120L of the pad 120 may have a cylindrical shape. In this case, the horizontal maximum lengths D1 and D2 may correspond to diameters of the lower and upper portions 120L and 120U respectively. However, in another embodiment, the upper portion 120U and the lower portion 120L of the pad 120 may have another shape such as a square pillar shape or an ovoid. In these cases, the horizontal maximum lengths D1 and D2 may correspond to a major axis defined by the greatest distance between points on the edge of the lower portion 120L and upper portion 120U respectively. In some embodiments, the upper portion 120U and the lower portion 120L of the pad 120 may have the same central axis AX. That is, a center of the upper portion 120U of the pad 120 and a center of the lower portion 120L may be aligned with each other in the vertical direction (a Z-axis direction).

In some embodiments, the pad 120 may include a barrier layer 120a in contact with the first bump 180, a filling layer 120c in contact with of the first via portion 131V of the first conductive pattern 131 of the redistribution structure RDS, and a seed layer 120b between the barrier layer 120a and the filling layer 120c. However, a boundary between the barrier layer 120a and the seed layer 120b and a boundary between the seed layer 120b and the filling layer 120c may not be clear and/or well defined. The filling layer 120c of the pad 120 may include, for example, a metal such as copper (Cu), aluminum (Al), silver (Ag), gold (Au), tungsten (W), or a combination thereof. The seed layer 120b of the pad 120 may include the same material as the filling layer 120c. The barrier layer 120a of the pad 120 may include titanium (Ti), tantalum (Ta), titanium nitride (TiN), tantalum nitride (TaN), or a combination thereof.

The first insulating layer IL2 may be spaced apart from the lower portion 120L of the pad 120 and may be in contact with a side surface and an upper surface of the upper portion 120U of the pad 120. For example, the first insulating layer IL2 may cover the side surface and the upper surface of the upper portion 120U of the pad 120. In some embodiments, a lower surface of the first insulating layer IL2 and a lower surface of the upper portion 120U of the pad 120 may be coplanar.

In some embodiments, the semiconductor package 100 may further include a fourth insulating layer IL1 below the first insulating layer IL2. The fourth insulating layer IL1 may include a fourth opening OP1. The upper portion 120U of the pad 120 may be located on the fourth insulating layer ILL and the lower portion 120L of the pad 120 may be located in the fourth opening OP1 of the fourth insulating layer IL1. A lower surface of the fourth insulating layer IL1 and a lower surface of the lower portion 120L of the pad 120 may be coplanar, and an upper surface of the fourth insulating layer IL1 and a lower surface of the upper portion 120U of the pad 120 may be coplanar. In some embodiments, the fourth insulating layer IL1 may be in contact with the lower surface of the upper portion 120U of the pad 120 and a side surface of the lower portion 120L of the pad 120, and may be separated from (e.g., not in contact with) the lower surface of the lower portion 120L of the pad 120 and the side and upper surfaces of the upper portion 120U of the pad 120. The fourth insulating layer IL1 may include, for example, an inorganic insulating material such as silicon oxide, silicon nitride, PSG, BPSG, FSG, or a combination thereof; an organic insulating material such as an insulating polymer; or a combination of an inorganic insulating material and an organic insulating material. In some embodiments, the fourth insulating layer IL1 may be formed from the PID material.

The first bump 180 may be in contact with the lower surface of the lower portion 120L of the pad 120. In some embodiments, the first bump 180 may be spaced apart from the side surface of the lower portion 120L of the pad 120 and the lower surface of the upper portion 120U of the pad 120. In some embodiments, the first bump 180 may include, for example, a metal such as tin (Sn), lead (Pb), silver (Ag), copper (Cu), bismuth (Bi), indium (In), zinc (Zn), antimony (Sb), or a combination thereof. The first bump 180 may be formed from, for example, a solder ball.

In some embodiments, the semiconductor package 100 may further include a protective insulating layer 110 below the fourth insulating layer IL1. The protective insulating layer 110 may include an opening 110OP, and the first bump 180 may be located in the opening 110OP of the protective insulating layer 110. The protective insulating layer 110 may physically protect an interface between the bump 180 and the pad 120, thereby improving the reliability of the semiconductor package 100. In some embodiments, the protective insulating layer 110 may include, for example, an inorganic insulating material such as silicon oxide, silicon nitride, PSG, BPSG, FSG, or a combination thereof; an organic insulating material such as an insulating polymer; or a combination of an inorganic insulating material and an organic insulating material.

In some embodiments, the semiconductor package 100 may further include a molding 170 on the redistribution structure RDS and the semiconductor chip 150. The molding 170 may physically and/or chemically protect the semiconductor chip 150 and the redistribution structure RDS. The molding 170 may include a polymer material, like a resin. The molding 170 may include, for example, a thermosetting resin, a thermoplastic resin, a UV curable resin, or a combination thereof. The molding 170 may include, for example, an epoxy resin, a silicone resin, or a combination thereof. The molding 170 may include, for example, an epoxy mold compound (EMC).

Figure 4:
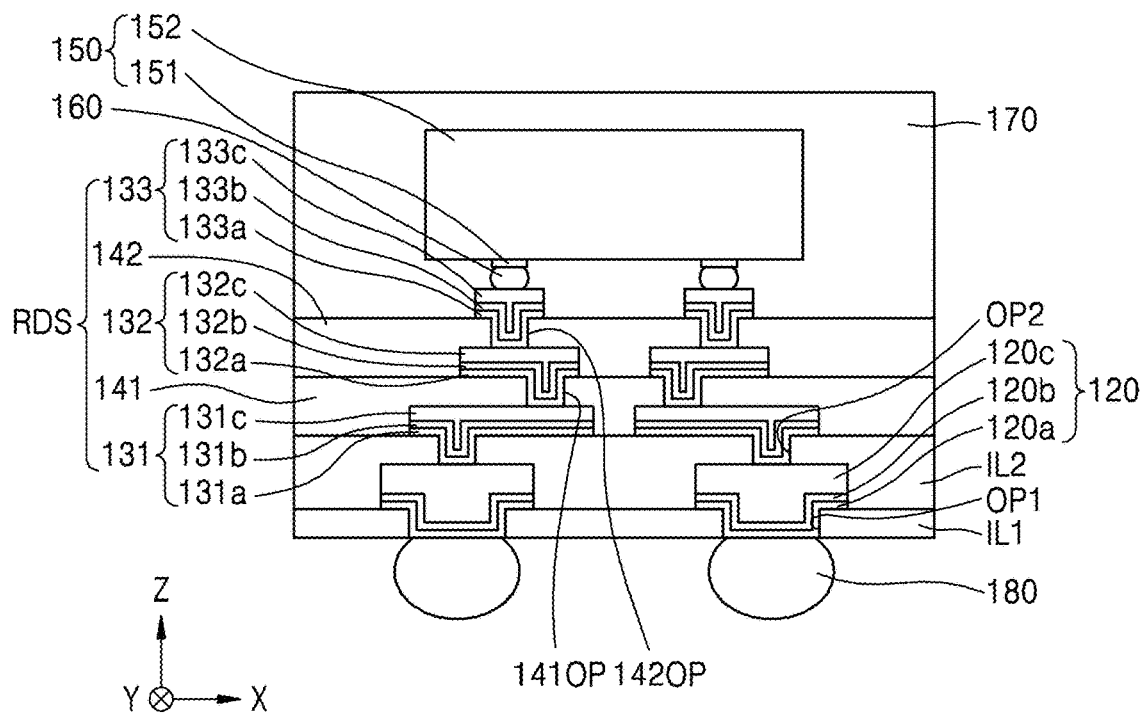
FIG. 4 is a cross-sectional view of a semiconductor package according to an embodiment of the inventive concepts.

FIG. 4 is a cross-sectional view of a semiconductor package 100a according to an embodiment of the inventive concepts.

Comparing FIGS. 1 and 4 with each other, the semiconductor package 100a of FIG. 4 may not include the protective insulating layer 110 unlike the semiconductor package 100 of FIG. 1. Therefore, a lower surface of a fourth insulating layer IL1 may be exposed to the outside of the semiconductor package 100a.

Figure 5:
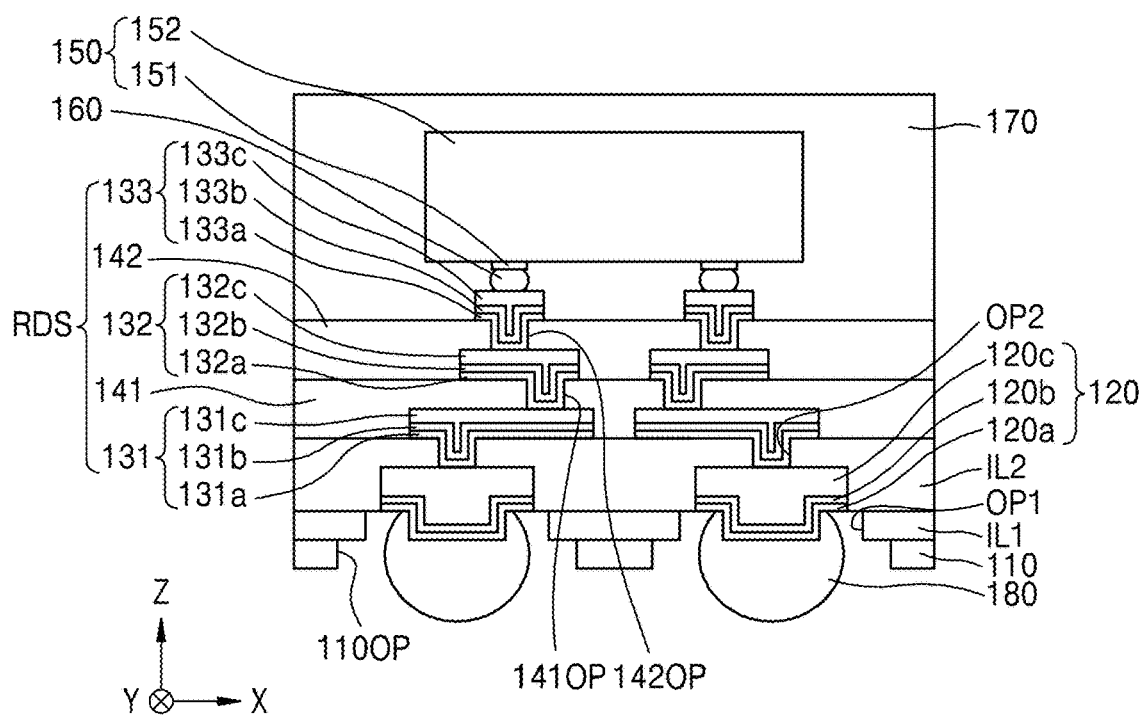
FIG. 5 is a cross-sectional view of a semiconductor package according to an embodiment of the inventive concepts.

FIG. 5 is a cross-sectional view of a semiconductor package 100b according to an embodiment of the inventive concepts.

Comparing FIGS. 1 and 5 with each other, in the semiconductor package 100b of FIG. 5, a fourth insulating layer IL1 may be spaced apart from a side surface of a lower portion of a pad 120, unlike in the semiconductor package 100 of FIG. 1. In some embodiments, the fourth insulating layer IL1 may be further spaced apart from a lower surface of an upper portion of the pad 120. A first bump 180 may be in contact with the lower surface and a side surface of the lower portion of the pad 120. When the first bump 180 is also in contact with the side surface of the lower portion of the pad 120, a contact area between the first bump 180 and the pad 120 may increase, and thus, the reliability of the semiconductor package 100b may be improved. In some embodiments, the first bump 180 may be also in contact with the lower surface of the upper portion of the pad 120. When the first bump 180 is also in contact with the lower surface of the upper portion of the pad 120, a contact area between the first bump 180 and the pad 120 may increase, and thus, the reliability of the semiconductor package 100b may be improved.

Figure 6:
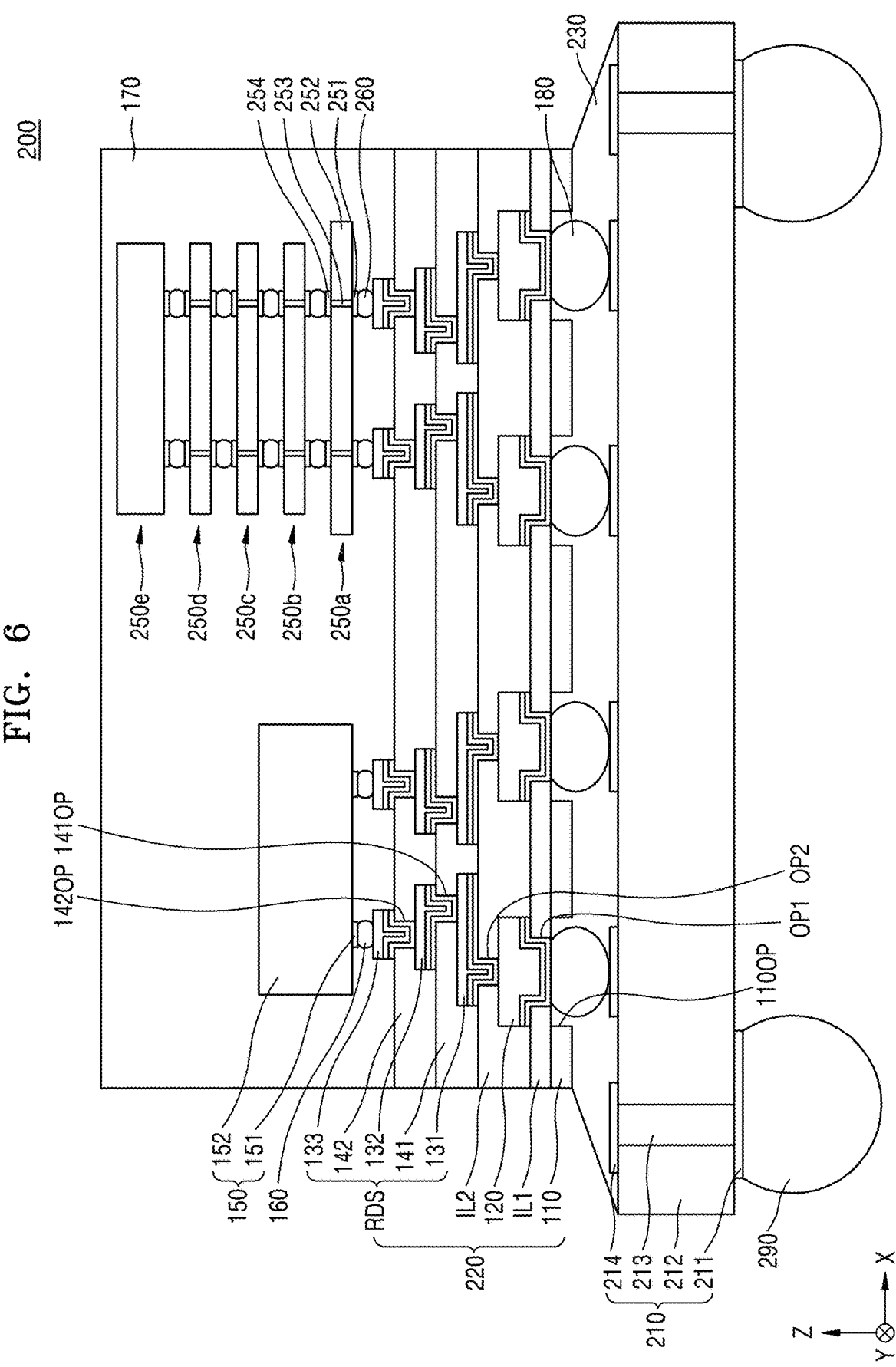
FIG. 6 is a cross-sectional view of a semiconductor package according to an embodiment of the inventive concepts.

FIG. 6 is a cross-sectional view of a semiconductor package 200 according to an embodiment of the inventive concepts.

Referring to FIG. 6, the semiconductor package 200 may include a package substrate 210, a third bump 290 below the package substrate 210, a first bump 180 on the package substrate 210, an interposer 220 on the first bump 180, and a semiconductor chip 150 (hereafter a first semiconductor chip 150) on the interposer 220.

The package substrate 210 may include a body 212, a lower pad 211 on a lower surface of the body 212, an upper pad 214 on an upper surface of the body 212, and a conductive pattern 213 connecting the lower pad 211 and the upper pad 214. In some embodiments, the package substrate 210 may include a printed circuit board. The body 212 of the package substrate 210 may include a phenol resin, an epoxy resin, a polyimide resin, or a combination thereof. For example, the body 212 of the package substrate 210 may include flame retardant 4 (FR4), tetrafunctional epoxy, polyphenylene ether, epoxy/polyphenylene oxide, bismaleimide triazine (BT), thermount, cyanate ester, polyimide, or liquid crystal polymer. The lower pad 211, the upper pad 214, and the conductive pattern 213 of the package substrate 210 may include, for example, a conductive material such as a metal (e.g., copper (Cu), aluminum (Al), silver (Ag), gold (Au), tungsten (W), titanium (Ti)), a doped semiconductive, a conductive organic material (e.g., a conductive polymer), carbon-based material (e.g., carbon nanotubes and graphene), or a combination thereof.

The third bump 290 may be in contact with the lower pad 211 of the package substrate 210. The third bump 290 may be used to connect the semiconductor package 200 to the outside. The third bump 290 may include, for example, a metal such as tin (Sn), lead (Pb), silver (Ag), copper (Cu), bismuth (Bi), indium (In), zinc (Zn), antimony (Sb), or a combination thereof. The third bump 290 may be formed from, for example, a solder ball.

The first bump 180 may be in contact with the upper pad 214 of the package substrate 210 and a pad 120 of the interposer 220. A detailed description of the first bump 180 is as described above with reference to FIGS. 1 to 5. In some embodiments, the semiconductor package 200 may further include an underfill 230 filling between the interposer 220 and the package substrate 210 and surrounding the first bump 180. The underfill 230 may be an insulating material, and may include, for example, a polymer material like a thermosetting resin, a thermoplastic resin, a UV curable resin, or a combination thereof; an epoxy resin, a silicone resin, or a combination thereof; an epoxy mold compound (EMC); or a combination thereof.

The interposer 220 may include the pad 120 on the first bump 180, a first insulating layer IL2 on the pad 120, and a redistribution structure RDS on the first insulating layer IL2. In some embodiments, the interposer 220 may further include a fourth insulating layer IL1 below the first insulating layer IL2. In some embodiments, the interposer 220 may further include a protective insulating layer 110 below the fourth insulating layer ILE A detailed description of the pad 120, the first insulating layer IL2, the redistribution structure RDS, the fourth insulating layer ILL and the protective insulating layer 110 is as described above with reference to FIGS. 1 to 5.

The first semiconductor chip 150 on the interposer 220 may be electrically connected to the redistribution structure RDS of the interposer 220. In some embodiments, the semiconductor package 200 may further include a second bump 160, which contacts a third conductive pattern 133 of the redistribution structure RDS of the interposer 220 and a chip pad 151 of the first semiconductor chip 150 and which connects the first semiconductor chip 150 and the interposer 220. A detailed description of the first semiconductor chip 150 and the second bump 160 is as described above with reference to FIG. 1.

In some embodiments, the semiconductor package 200 may further include at least one second semiconductor chip on the interposer 220. For example, the semiconductor package 200 may include a plurality of second semiconductor chips 250a to 250e stacked on the interposer 220. In some embodiments, each of the second semiconductor chips 250a to 250e may include a body 252, an upper pad 254 on an upper surface of the body 252, a lower pad 251 on a lower surface of the body 252, and a via 253 connecting between the upper pad 254 and the lower pad 251 and passing through the body 252. In some embodiments, the uppermost second semiconductor chip 250e may not include the upper pad 254 and the via 253.

The body 252 of each of the second semiconductor chips 250a to 250e may include a substrate. The body 252 may include an active surface (the lower surface of the body 252 in FIG. 6) and an inactive surface opposite the active surface (the upper surface of the body 252 in FIG. 6). The body 252 may further include an integrated circuit on the active surface. The substrate may include a semiconductor material. The integrated circuit may include a memory circuit, a logic circuit, or a combination thereof. Each of the second semiconductor chips 250a to 250e may include the same and/or different integrated circuits as the other second semiconductor chips 250a to 250e. For example, the lowermost second semiconductor chip 250a may include a logic circuit, and the other second semiconductor chips 250a to 250d may each include a memory circuit. The lower pad 251, the upper pad 254, and the via 253 of each of the second semiconductor chips 250a to 250e may include, for example, a conductive material such as a metal (e.g., copper (Cu), aluminum (Al), silver (Ag), gold (Au), tungsten (W), titanium (Ti)), a doped semiconductive, a conductive organic material (e.g., a conductive polymer), carbon-based material (e.g., carbon nanotubes and graphene), or a combination thereof.

In some embodiments, the semiconductor package 200 may further include fourth bumps 260 between adjacent second semiconductor chips (e.g., between the second semiconductor chips 250a and 250b, between the second semiconductor chips 250b and 250c, between the second semiconductor chips 250c and 250d, and between the second semiconductor chips 250d an 250e) and between the lowermost second semiconductor chip, (e.g., the second semiconductor chip 250a), and the interposer 220. Each of some of the fourth bumps 260 may be in contact with the lower pad 251 of an upper second semiconductor chip (e.g., the second semiconductor chip 250c) of two adjacent second semiconductor chips (e.g., the second semiconductor chips 250b and 250c) and the upper pad 254 of the lower second semiconductor chip (e.g., the second semiconductor chip 250*b*). The other fourth bump 260 may be in contact with the lower pad 251 of the lowermost second semiconductor chip 250*a* and the third conductive pattern 133 of the redistribution structure RDS of the interposer 220. The plurality of semiconductor chips 250*a* to 250*e* may be electrically connected to the third conductive pattern 133 of the redistribution structure RDS of the interposer 220 via the upper pad 254, the via 253, the lower pad 251, and the fourth bumps 260. The fourth bumps 260 may include, for example, a metal such as tin (Sn), lead (Pb), silver (Ag), copper (Cu), bismuth (Bi), indium (In), zinc (Zn), antimony (Sb), or a combination thereof. The fourth bumps 260 may be formed from, for example, solder balls.

In some embodiments, the semiconductor package 200 may further include chip adhesive layers and/or underfills which are located between neighboring second semiconductor chips (e.g., between the second semiconductor chips 250*a* and 250*b*, between the second semiconductor chips 250*b* and 250*c*, between the second semiconductor chips 250*c* and 250*d*, and between the second semiconductor chips 250*d* an 250*e*) and between the lowermost second semiconductor chip, (e.g., second semiconductor chip 250*a*) and the interposer 220 and which surround the fourth bumps 260. In some embodiments, the semiconductor package 200 may further include a molding 170 covering the interposer 220, the first semiconductor chip 150, and the plurality of second semiconductor chips 250*a* to 250*e*.

Figure 7A:
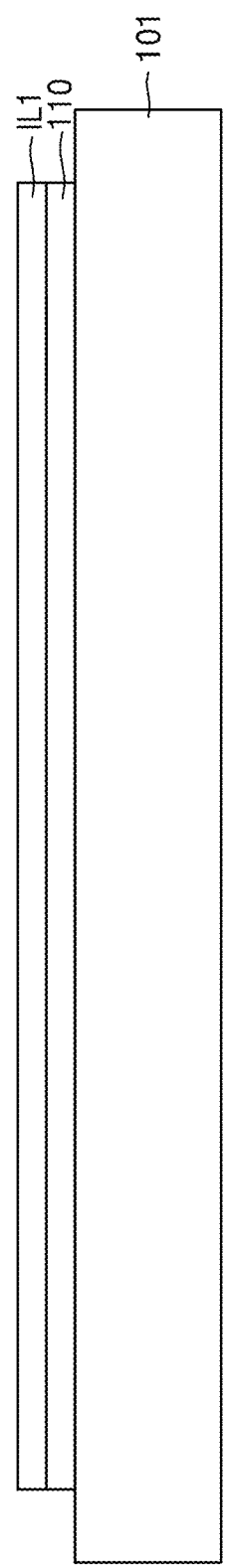
FIGS. 7A to 7Y are cross-sectional views illustrating a method of manufacturing a semiconductor package according to an embodiment of the inventive concepts.
Figure 7B:
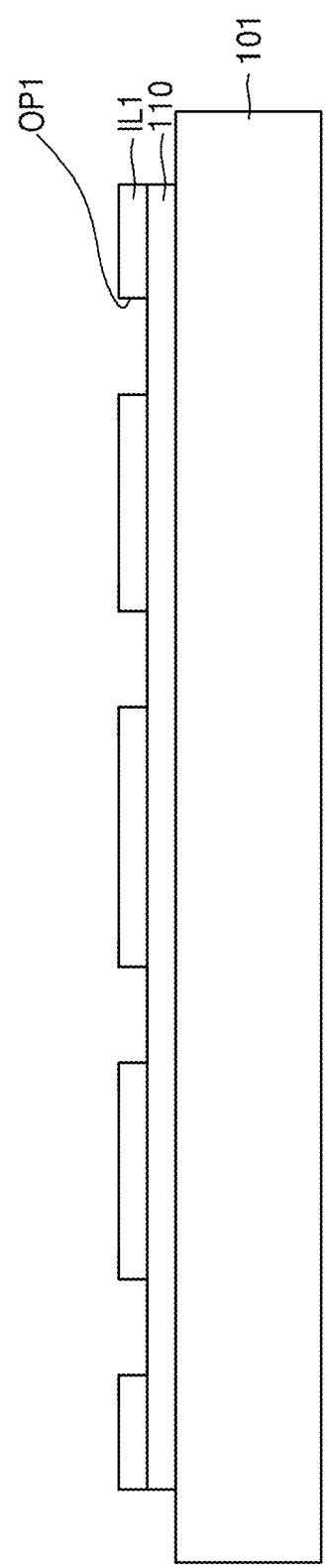
Figure 7C:
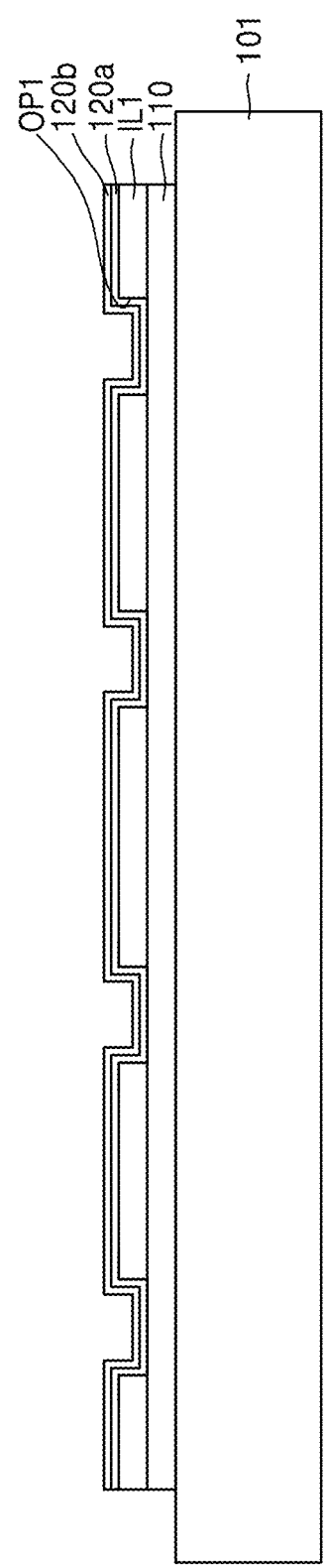
Figure 7D:
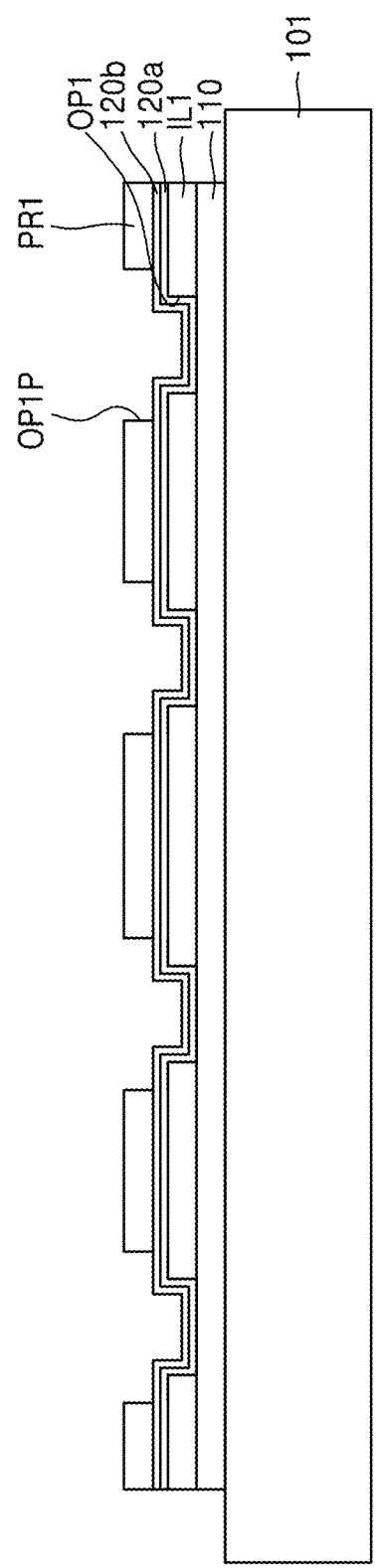
Figure 7E:
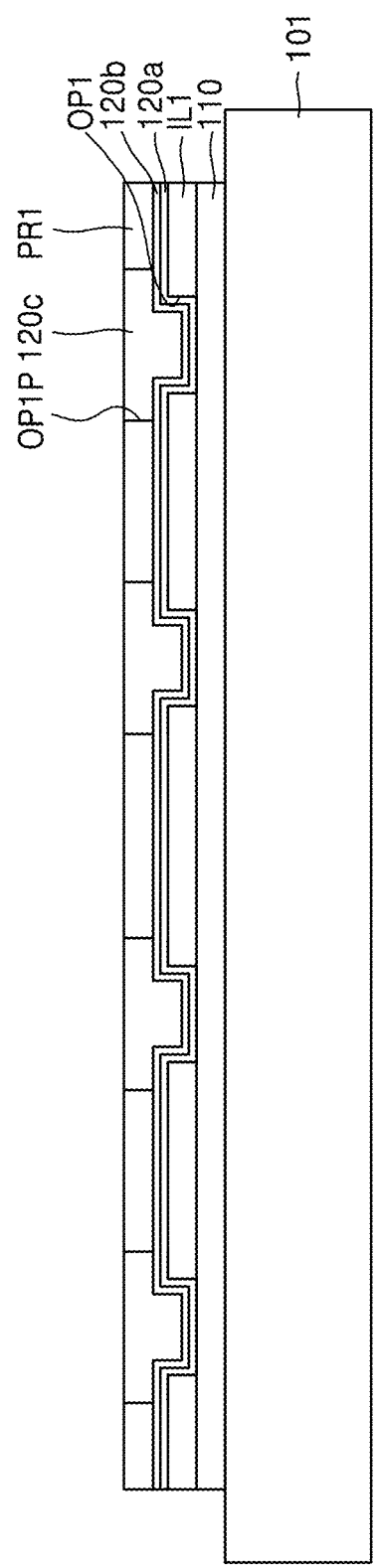
Figure 7F:
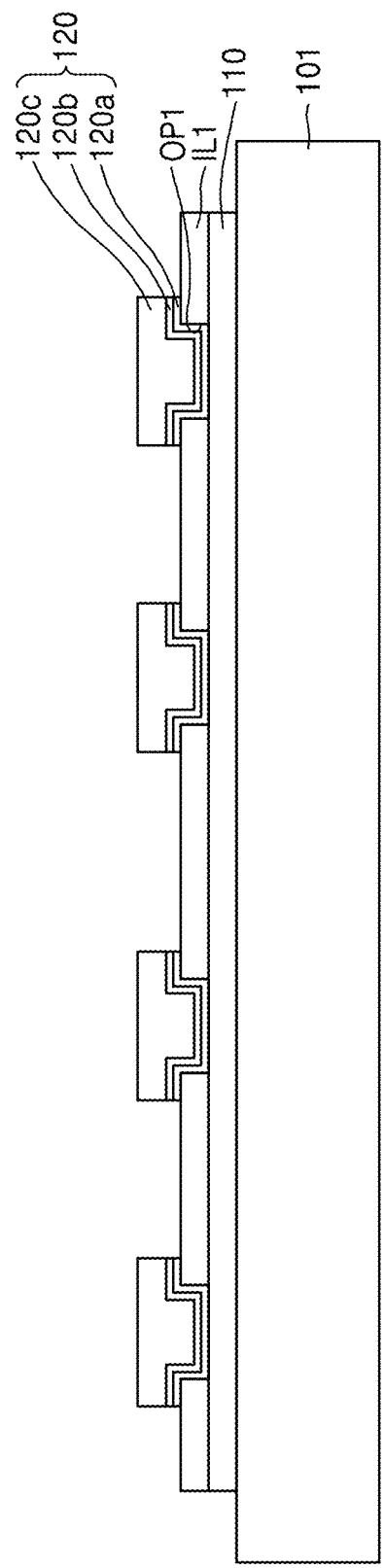
Figure 7G:
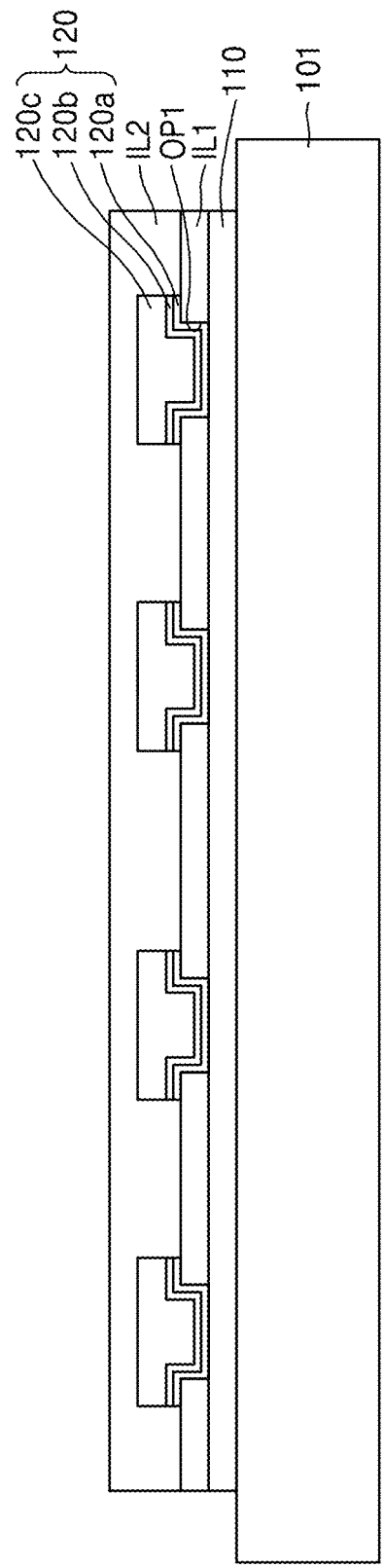
Figure 7H:
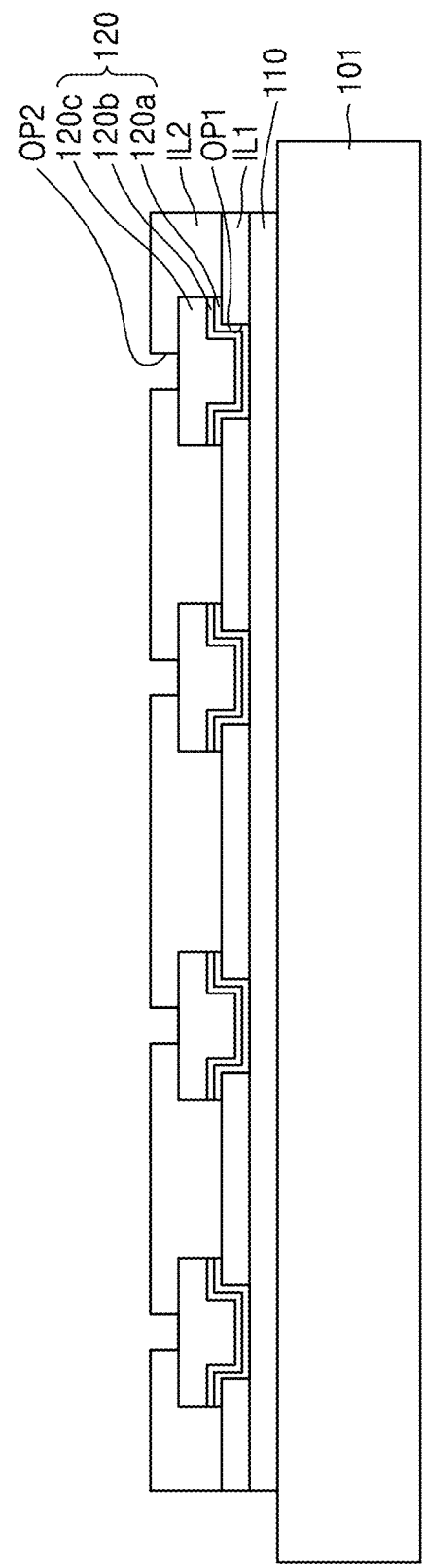
Figure 7I:
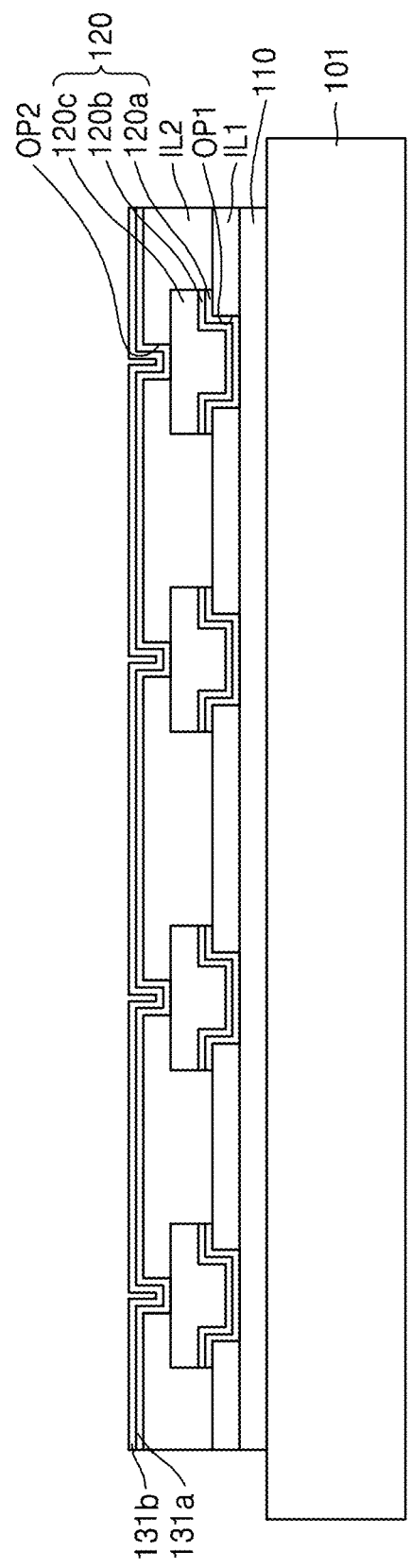
Figure 7J:
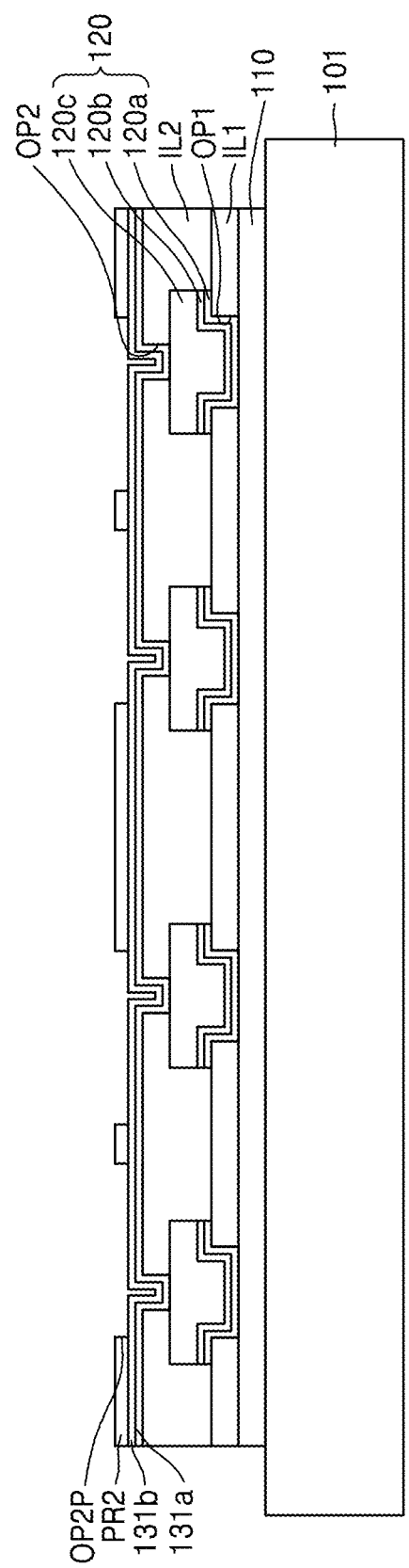
Figure 7K:
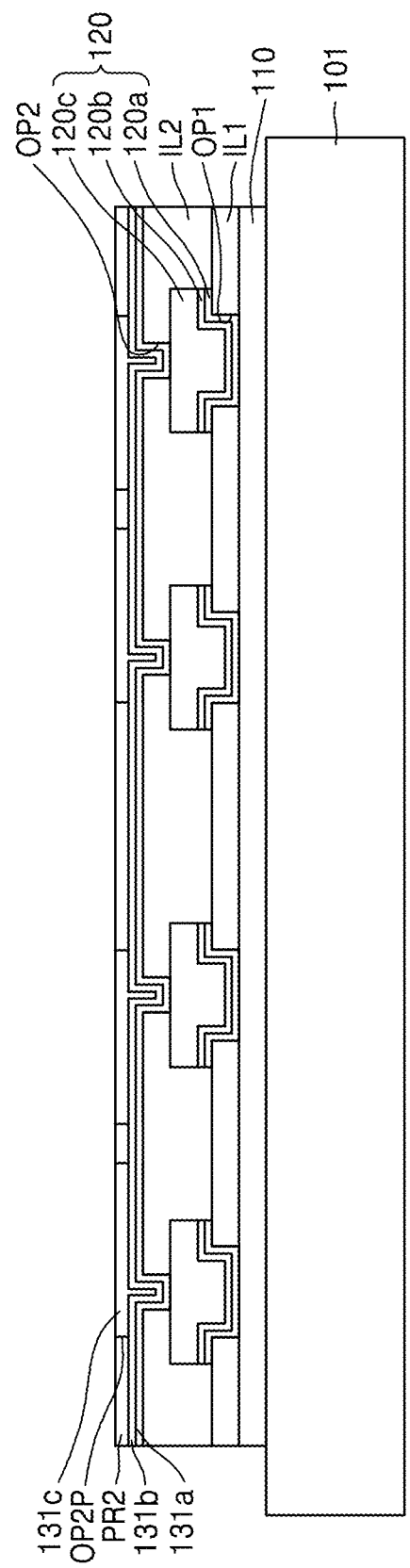
Figure 7L:
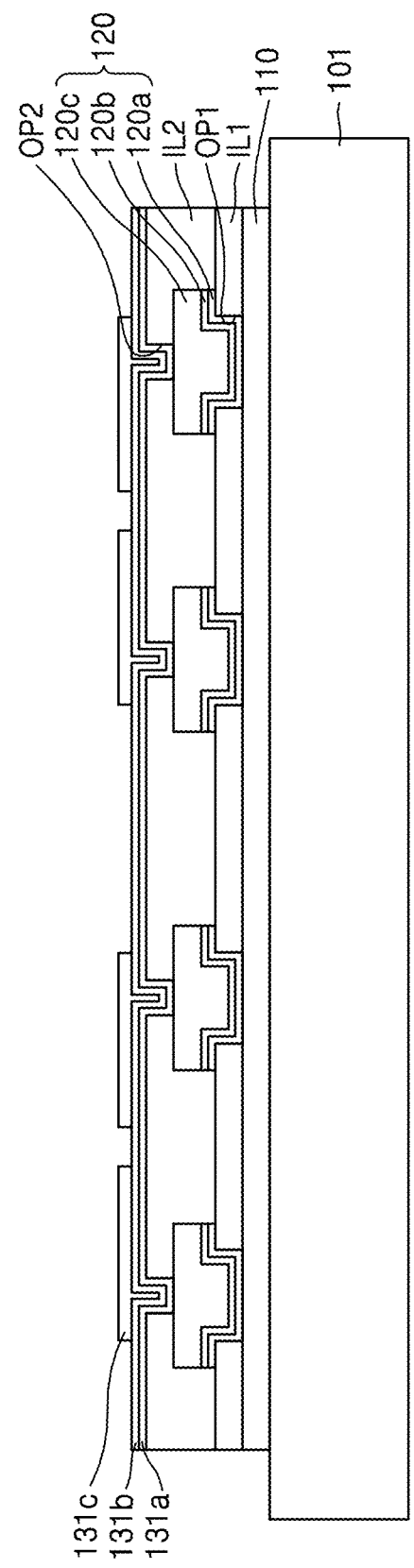
Figure 7M:
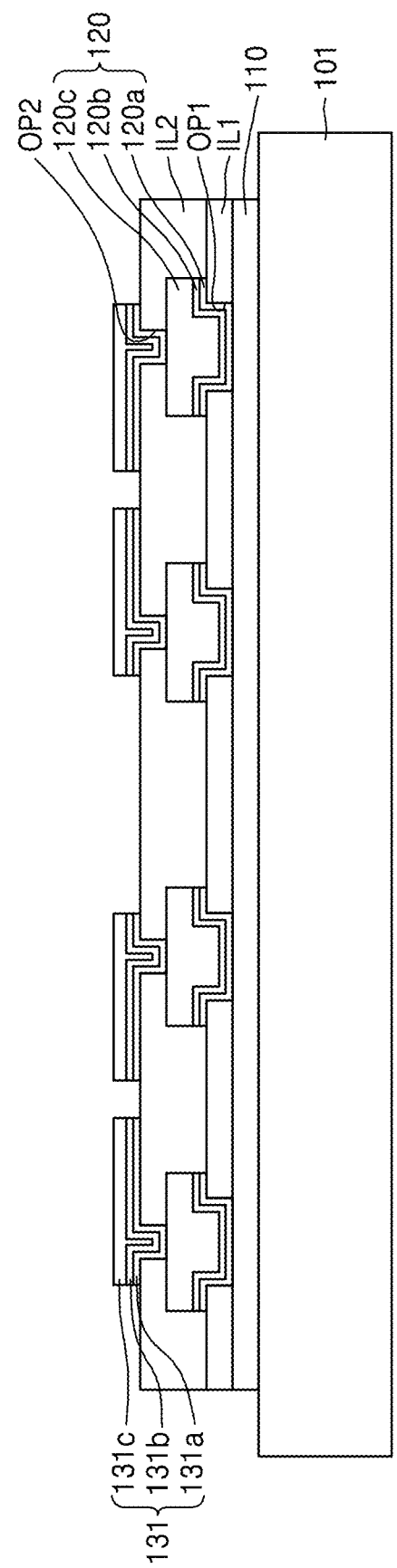
Figure 7N:
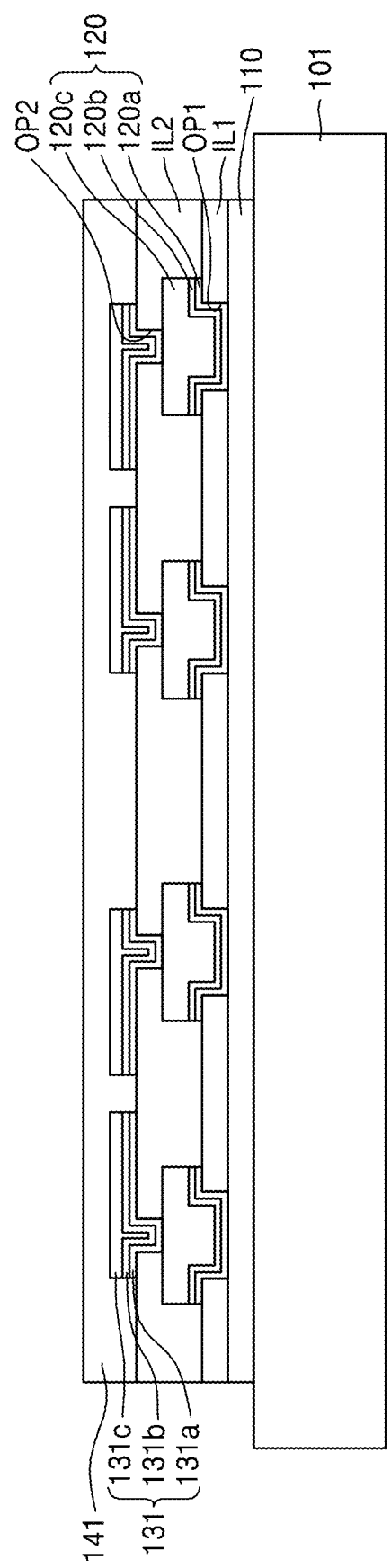
Figure 70:
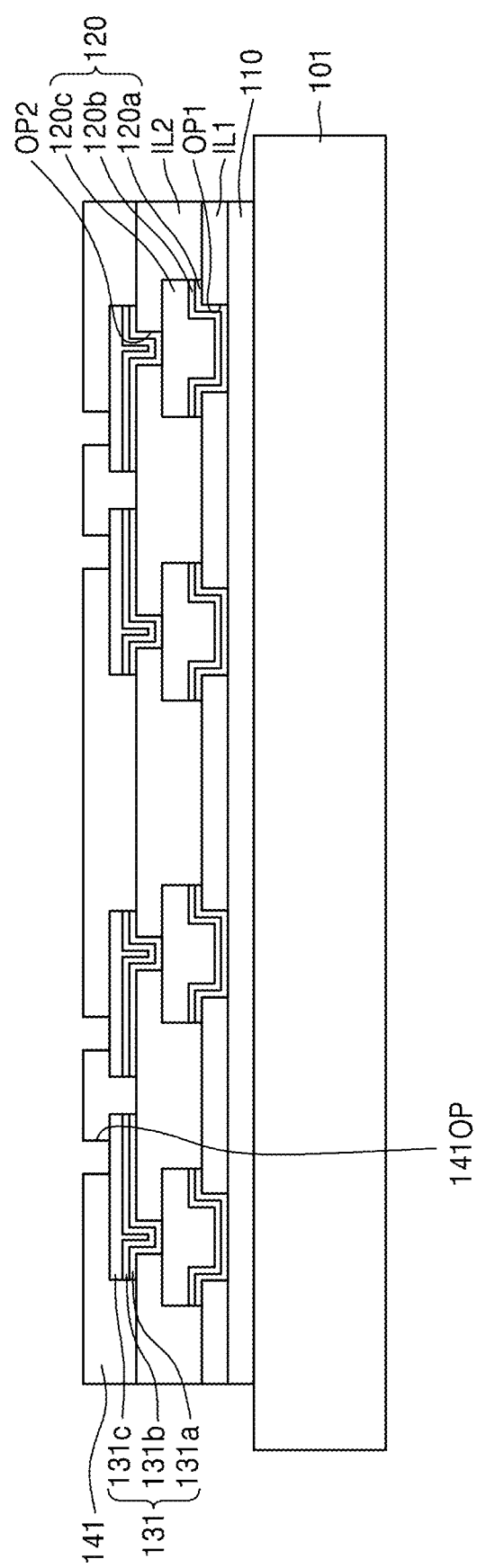
Figure 7P:
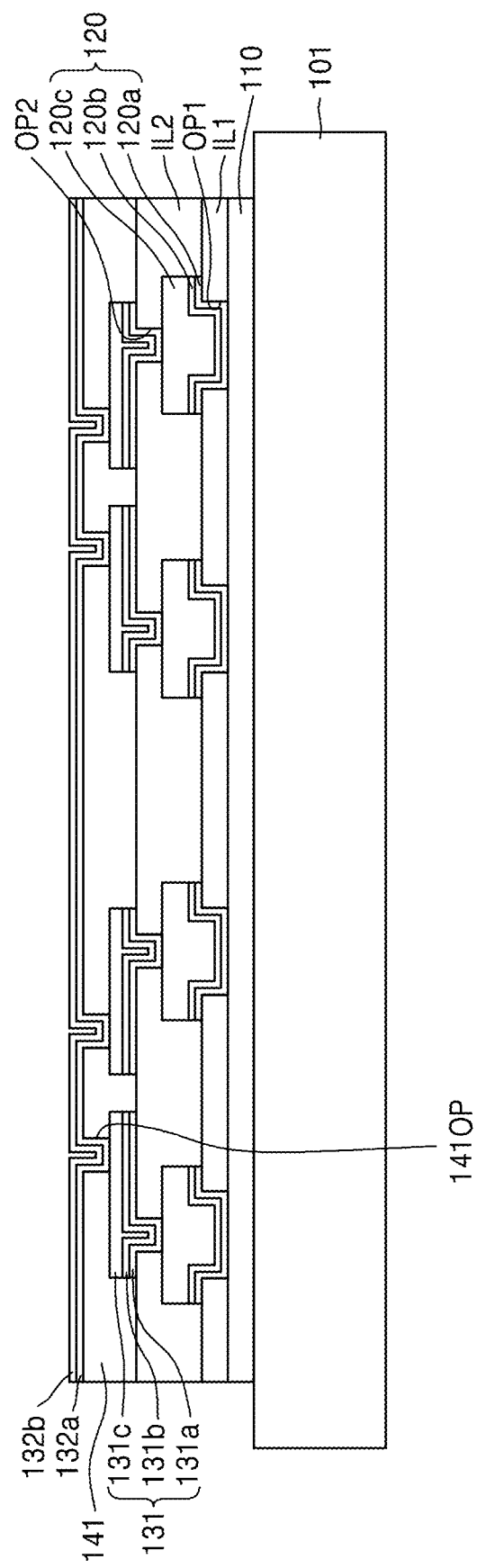
Figure 7Q:
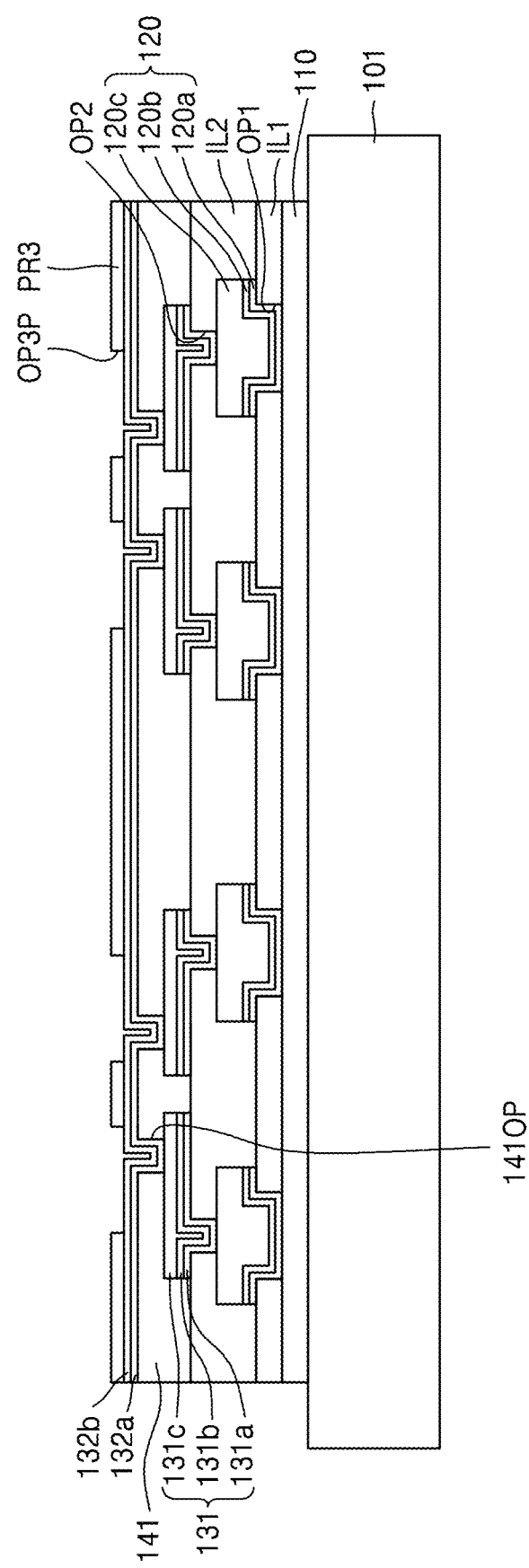
Figure 7R:
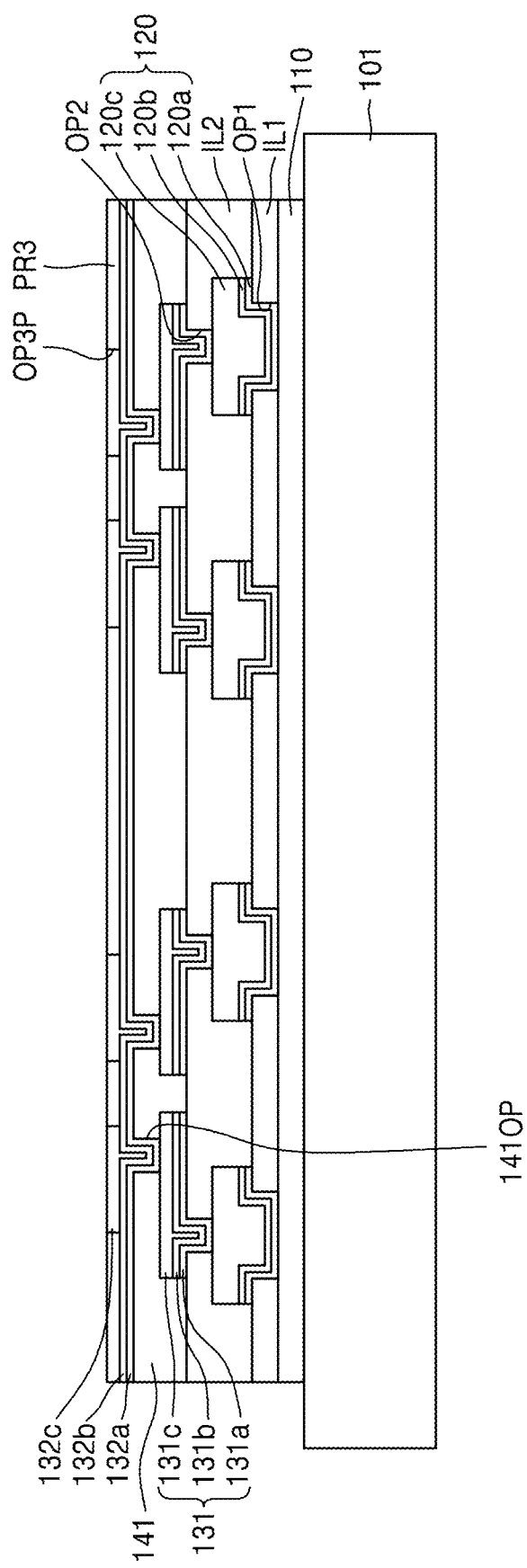
Figure 7S:
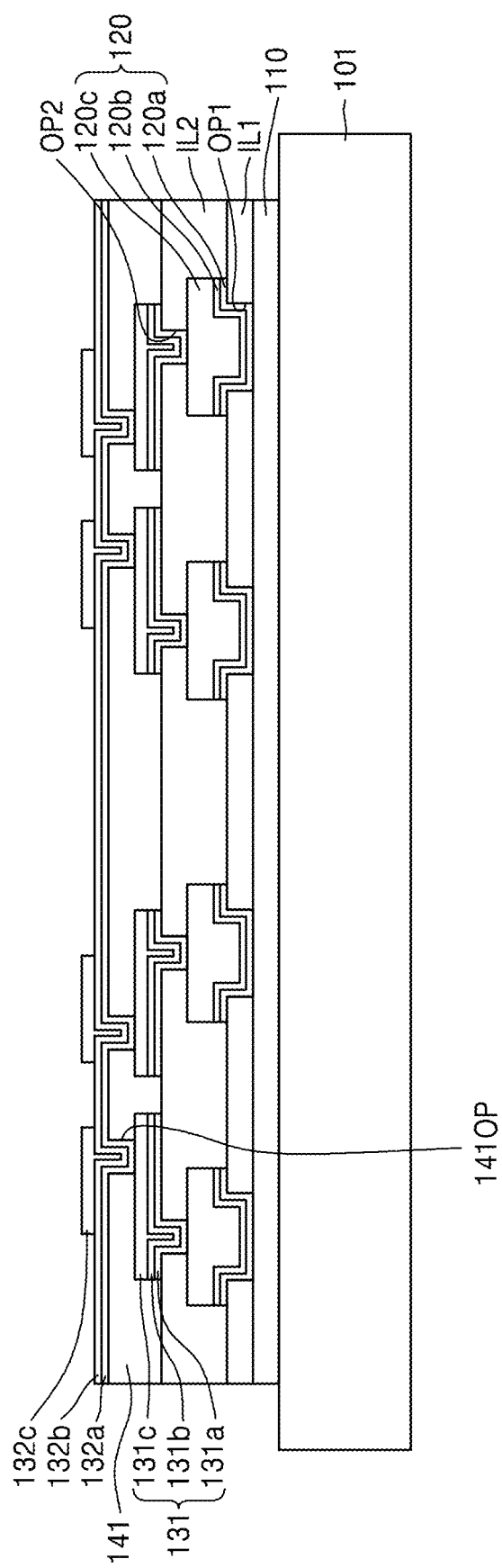
Figure 7T:
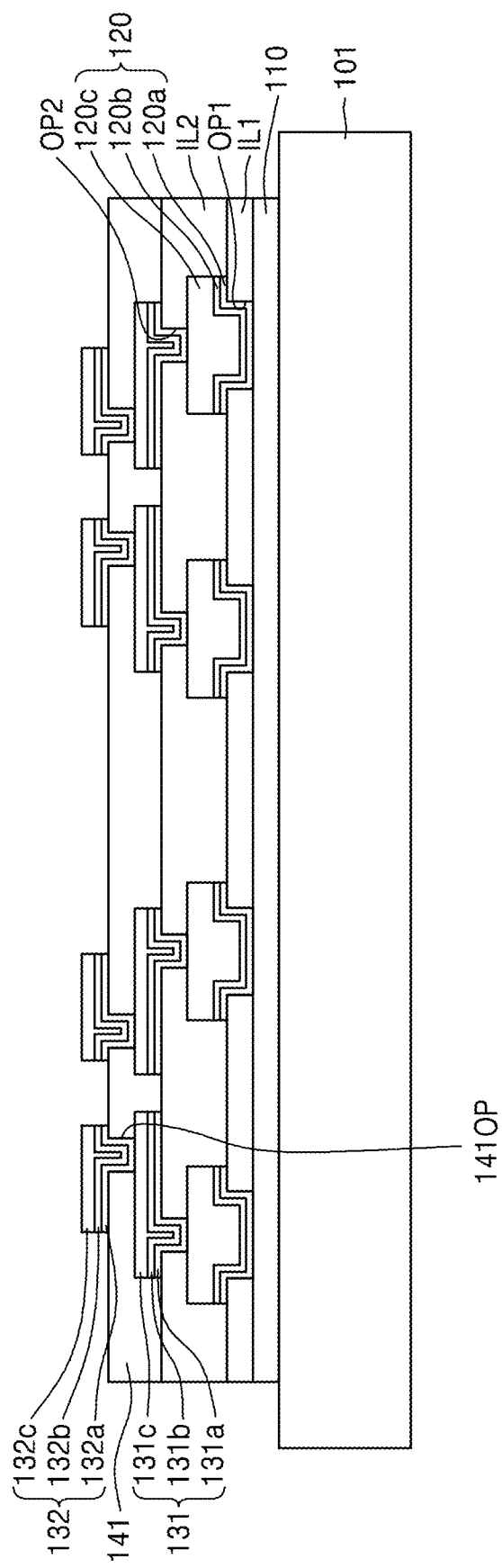
Figure 7U:
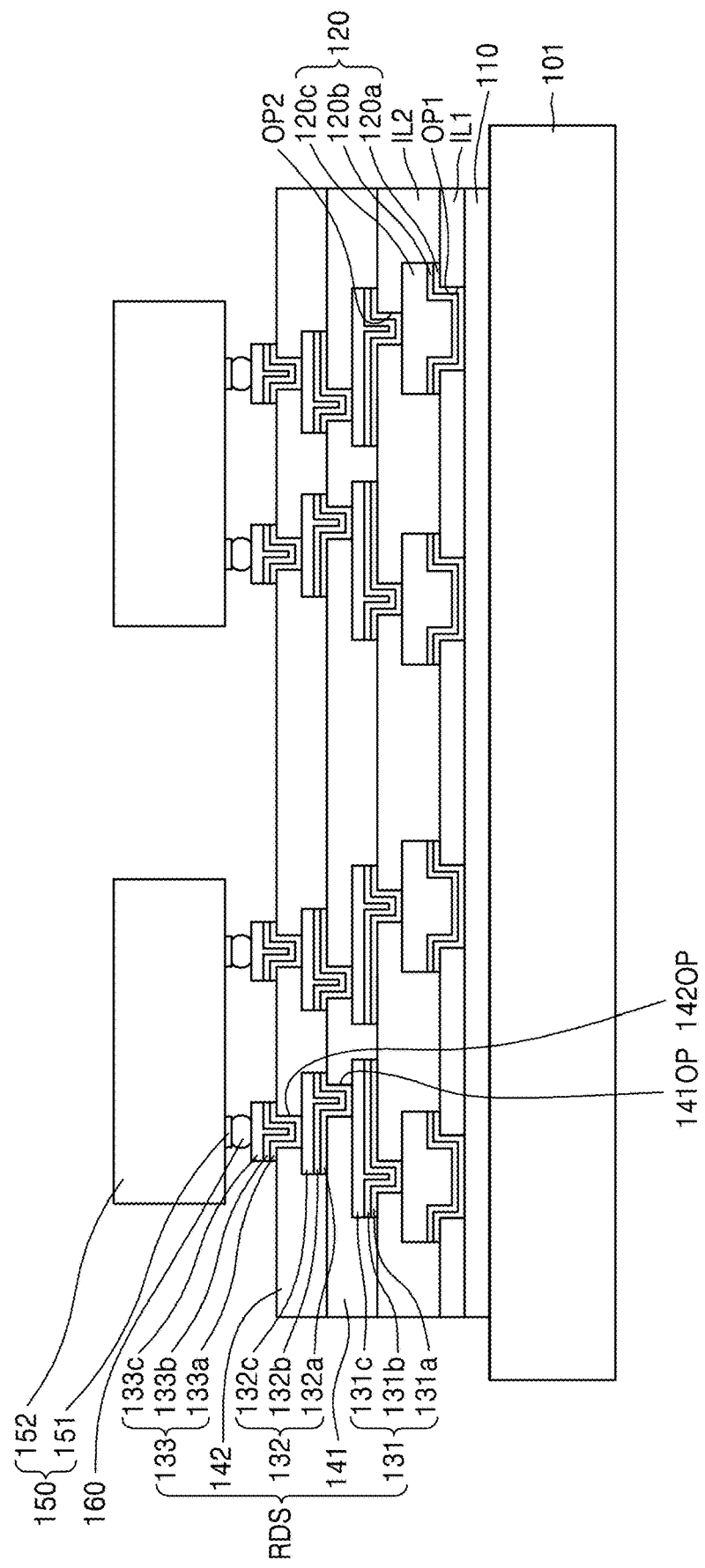
Figure 7V:
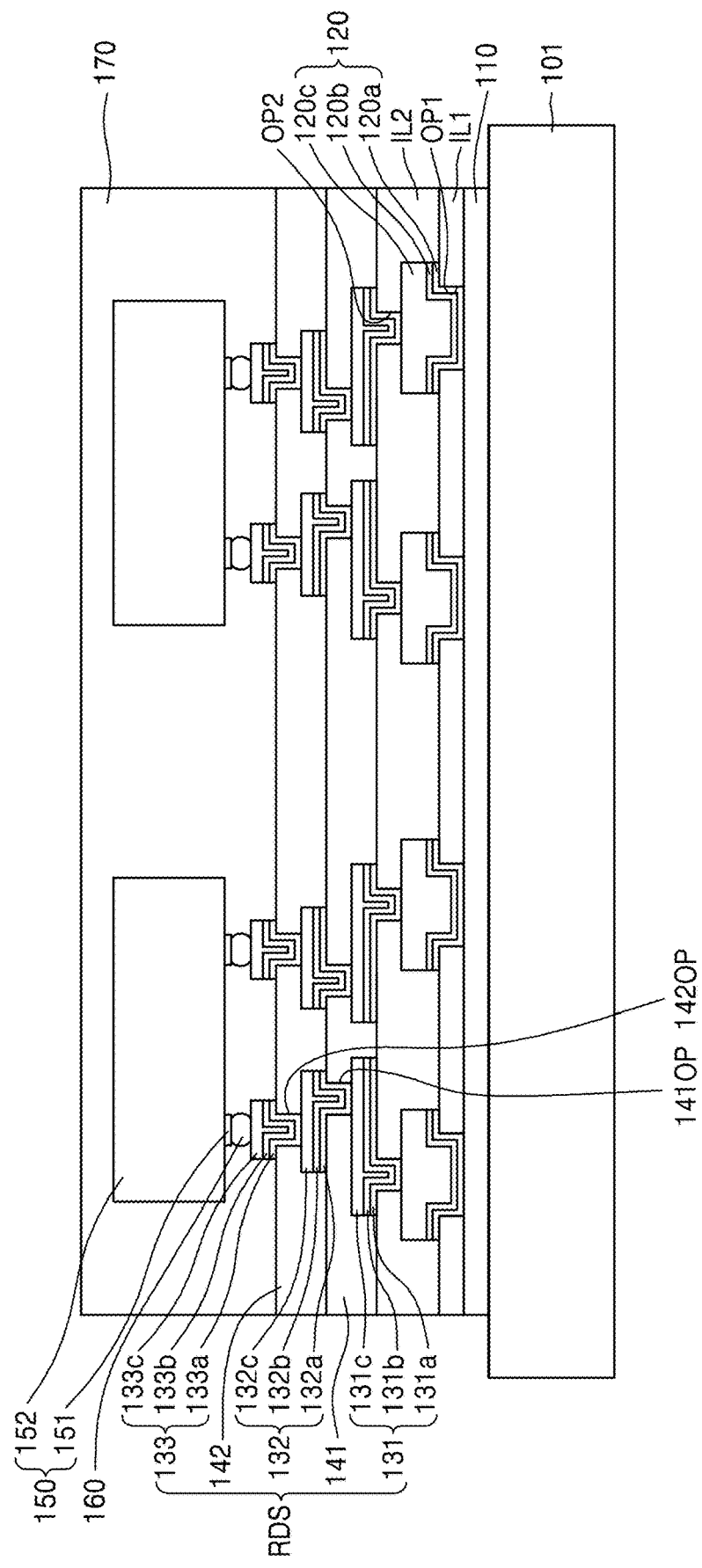
Figure 7W:
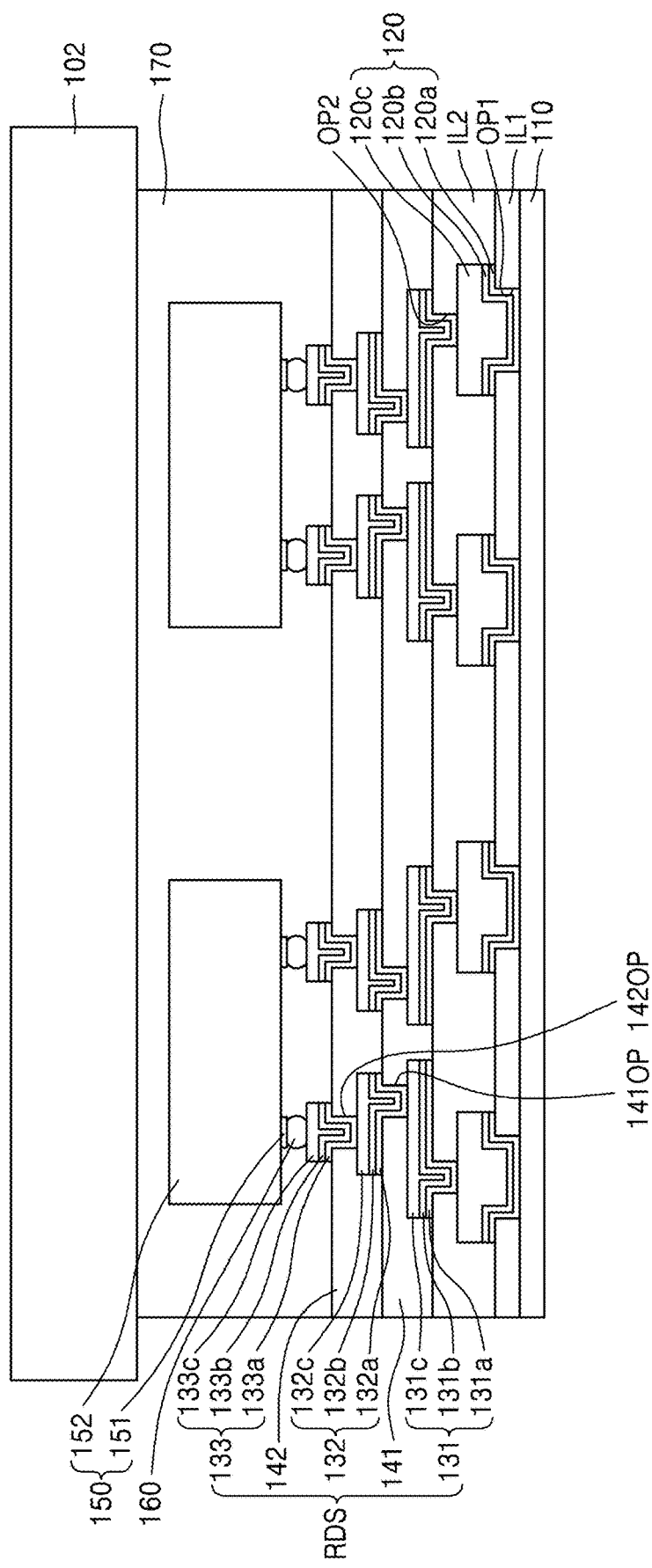
Figure 7X:
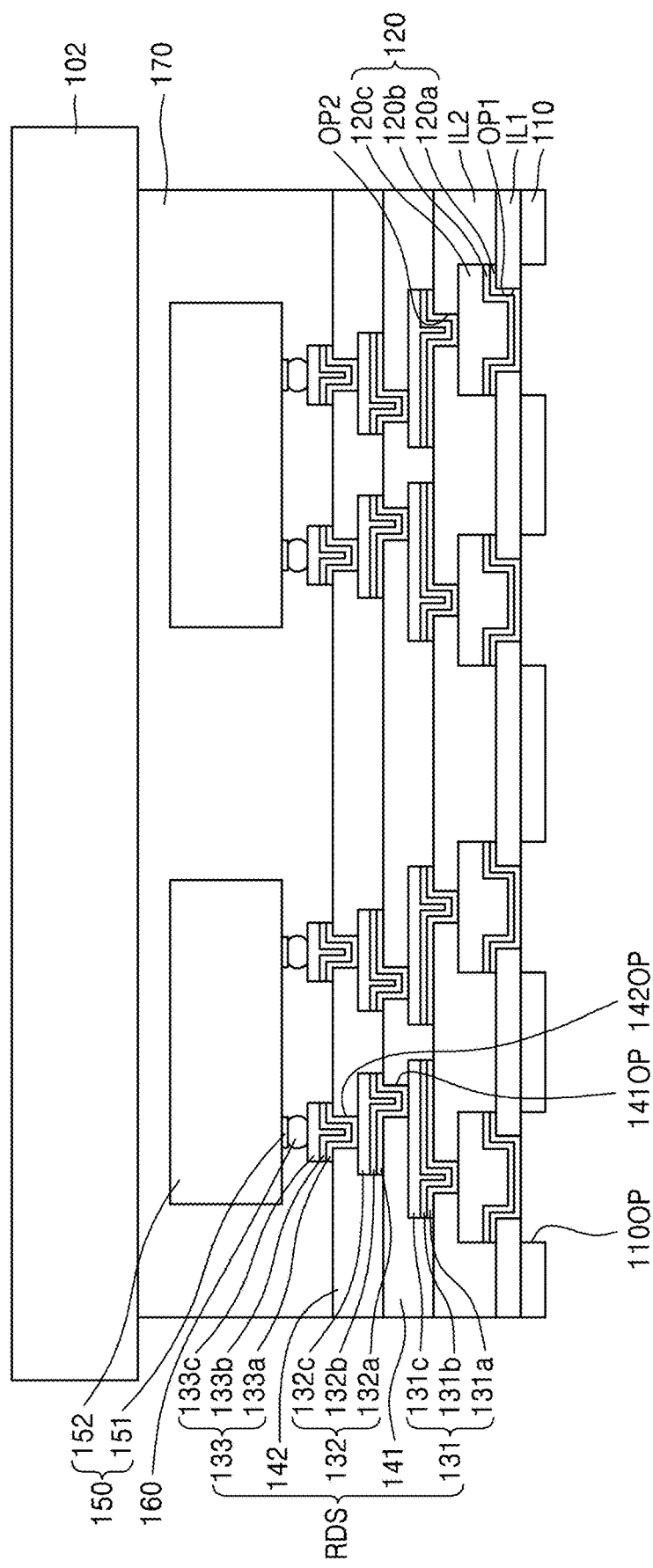
Figure 7Y:
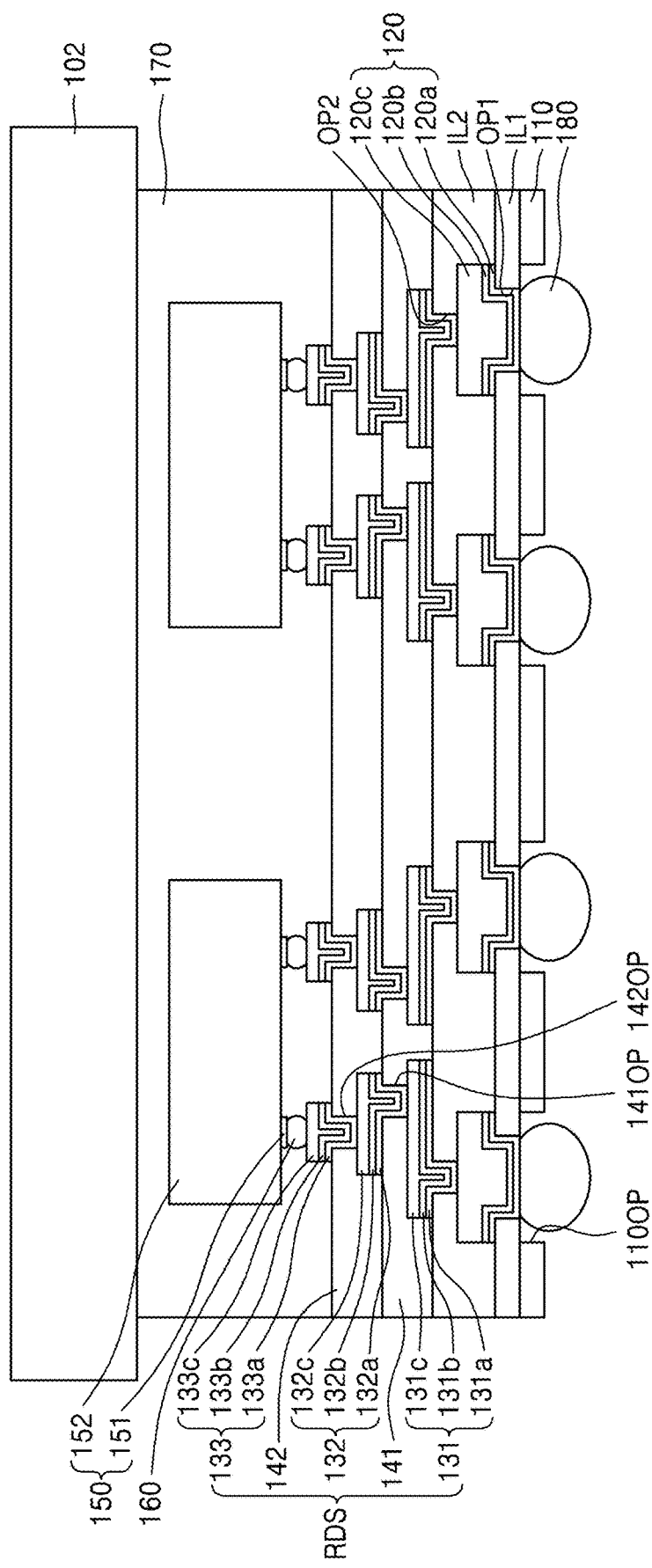

FIGS. 7A to 7Y are cross-sectional views illustrating a method of manufacturing a semiconductor package according to an embodiment of the inventive concepts.

Referring to FIG. 7A, a protective insulating layer 110 may be formed on a carrier 101, and a fourth insulating layer IL1 may be formed on the protective insulating layer 110. In some embodiments, the carrier 101 may include glass. The protective insulating layer 110 and the fourth insulating layer IL1 may be formed by, for example, spin coating or slip coating.

Referring to FIG. 7B, a first opening OP1 may be formed in the fourth insulating layer IL1 to expose the protective insulating layer 110, forming a fourth insulating layer IL1. When the fourth insulating layer IL1 includes a PID material, the first opening OP1 may be formed in the fourth insulating layer IL1 by selective exposure and development of the fourth insulating layer IL1.

Referring to FIG. 7C, a barrier layer 120*a* and a seed layer 120*b* may be formed on the fourth insulating layer ILL The barrier layer 120*a* and the seed layer 120*b* may be formed conformally on the protective insulating layer 110, side surface of the first opening OP1 of the fourth insulating layer IL1, and an upper surface of the fourth insulating layer IL1. For example, the barrier layer 120*a* and the seed layer 120*b* may be formed by chemical vapor deposition (CVD) or physical vapor deposition (PVD).

Referring to FIG. 7D, a first photoresist layer PR1 may be formed on the seed layer 120*b*. The first photoresist layer PR1 may be formed by, for example, spin coating or slip coating. Next, an opening OP1P may be formed in the first photoresist layer PR1 to expose the seed layer 120*b*. For example, the opening OP1P may be formed in the first photoresist layer PR1 by selective exposure and development of the first photoresist layer PRE Referring to FIG. 7E, a filling layer 120*c* may be formed on the seed layer 120*b* to fill the opening OP1P of the first photoresist layer PR1. The filling layer 120*c* may be formed by, for example, electroplating.

Referring to FIGS. 7E and 7F, the first photoresist layer PR1 may be removed. The first photoresist layer PR1 may be removed by, for example, ashing (e.g., plasma ashing), dry etching, and/or wet etching. Next, the seed layer 120*b* and the barrier layer 120*a* may be etched using the filling layer 120*c* as an etching mask, forming the barrier layer 120*a* and the seed layer 120*b*. Therefrom, a pad 120 may be obtained.

Referring to FIG. 7G, a first insulating layer IL2 may be formed on the fourth insulating layer IL1 and the pad 120. The first insulating layer IL2 may be formed by, for example, spin coating or slip coating. As the lower portion of the pad 120 is formed in the first opening OP1 of the fourth insulating layer IL1 and only an upper portion of the pad 120 protrudes from an upper surface of the fourth insulating layer ILL undulations of an upper surface of the first insulating layer IL2 may not be influenced by a thickness of the lower portion of the pad 120 but by only a thickness of the upper portion of the pad 120. Therefore, even when the pad 120 is formed thick to improve the reliability of the semiconductor package, the undulations of the upper surface of the first insulating layer IL2 may not be significant, and the upper surface of the second insulating later IL2 may not be significantly deteriorated and the first insulating layer IL2 having a relatively flat upper surface.

Referring to FIG. 7H, a second opening OP2 may be formed in the first insulating layer IL2 to expose the pad 120, forming the first insulating layer IL2. When the first insulating layer IL2 includes a PID material, the second opening OP2 may be formed in the first insulating layer IL2 by selective exposure and development of the first insulating layer IL2. Because the upper surface of the first insulating layer IL2 may be formed relatively flat, the probability that the second opening OP2 is not formed at a desired position and at a desired size due to a reduction in a depth-of-focus (DOF) margin, which may be caused by the undulations of the upper surface of the first insulating layer IL2, may be decreased.

Referring to FIG. 7I, a first barrier layer 131*a* and a first seed layer 131*b* may be formed on the first insulating layer IL2. The first barrier layer 131*a* and the first seed layer 131*b* may be formed conformally on the pad 120, side surface of the second opening OP2 of the first insulating layer IL2, and an upper surface of the first insulating layer IL2. For example, the first barrier layer 131*a* and the first seed layer 131*b* may be formed by chemical vapor deposition or physical vapor deposition.

Referring to FIG. 7J, a second photoresist layer PR2 may be formed on the first seed layer 131*b*. The second photoresist layer PR2 may be formed by, for example, spin coating or slip coating. Next, an opening OP2P may be formed in the second photoresist layer PR2 to expose the first seed layer 131*b*. For example, the opening OP2P may be formed in the second photoresist layer PR2 by selective exposure and development of the second photoresist layer PR2. Because the upper surface of the first insulating layer IL2 is formed relatively flat, an upper surface of the second photoresist layer PR2 may also be formed relatively flat. Accordingly, the probability that an exposure process is influenced by the undulations of the upper surface of the second photoresist layer PR2 and thus the opening OP2P is not formed at a desired position and in a desired size may be decreased.

Referring to FIG. 7K, a first filling layer 131*c* may be formed on the first seed layer 131*b* to fill the opening OP2P of the second photoresist layer PR2. The first filling layer 131*c* may be formed by, for example, electroplating.

Referring to FIGS. 7K and 7L, the second photoresist layer PR2 may be removed. The second photoresist layer PR2 may be removed by, for example, ashing (e.g., plasma ashing), dry etching, and/or wet etching.

Referring to FIG. 7M, the first seed layer 131b and the first barrier layer 131a may be etched using the first filling layer 131c as an etching mask thus forming the first seed layer 131b and the first barrier layer 131a. As a result, a first conductive pattern 131 may be obtained.

Referring to FIG. 7N, a second insulating layer 141 may be formed on the first insulating layer IL2 and the first conductive pattern 131. The second insulating layer 141 may be formed by, for example, spin coating, or slip coating.

Referring to FIG. 7O, a second opening 141OP may be formed in the second insulating layer 141 to expose the first conductive pattern 131, forming the second insulating layer 141. When the second insulating layer 141 includes a PID material, the second opening 141OP may be formed in the second insulating layer 141 by selective exposure and development of the second insulating layer 141.

Referring to FIG. 7P, a second barrier layer 132a and a second seed layer 132b may be formed on the second insulating layer 141. The second barrier layer 132a and the second seed layer 132b may be formed conformally on the first conductive pattern 131, side surface of the second opening 141OP of the second insulating layer 141, and the upper surface of the second insulating layer 141. For example, the second barrier layer 132a and the second seed layer 132b may be formed by chemical vapor deposition or physical vapor deposition.

Referring to FIG. 7Q, a third photoresist layer PR3 may be formed on the second seed layer 132b. The third photoresist layer PR3 may be formed by, for example, spin coating or slip coating. Next, an opening OP3P may be formed in the third photoresist layer PR3 to expose the second seed layer 132b. For example, the opening OP3P may be formed in the third photoresist layer PR3 by selective exposure and development of the third photoresist layer PR3.

Referring to FIG. 7R, a second filling layer 132c may be formed on the second seed layer 132b to fill the opening OP3P of the third photoresist layer PR3. The second filling layer 132c may be formed by, for example, electroplating.

Referring to FIGS. 7R and 7S, the third photoresist layer PR3 may be removed. The third photoresist layer PR3 may be removed by, for example, ashing (e.g., plasma ashing), dry etching, and/or wet etching.

Referring to FIG. 7T, the second seed layer 132b and the second barrier layer 132a may be etched using the second filling layer 132c as an etching mask, forming a second seed layer 132b and a second barrier layer 132a. As a result, a second conductive pattern 132 may be obtained.

Referring to FIG. 7U, the third insulating layer 142 may be formed on the second insulating layer 141 and the second conductive pattern 132, the third opening 142OP may be formed in the third insulating layer 142, and a third conductive pattern 133 may be formed on the third insulating layer 142, similar to operations described above with reference to FIGS. 7N to 7T. As a result, a redistribution structure RDS which includes the second insulating layer 141, the third insulating layer 142, and the first to third conductive patterns 131 to 133 may be obtained. Next, a plurality of semiconductor chips 150 may be attached to the redistribution structure RDS via a plurality of the second bumps 160. For example, the second bumps 160 may be reflown to bond the plurality of semiconductor chips 150 to the redistribution structure RDS.

Referring to FIG. 7V, a molding 170 may be formed on the redistribution structure RDS and the plurality of semiconductor chips 150.

Referring to FIGS. 7V and 7W, the carrier 101 may be detached from the protective insulating layer 110 and the molding 170 may be attached to a support 102. For example, the molding 170 may be attached to the support 102, and the carrier 101 may be separated from the protective insulating layer 110 by causing a reaction of the protective insulating layer 110 by, for example, the application of a laser and/or heat. The protective insulating layer 110 may be used to separate the carrier 101 and thus may be a release layer.

Referring to FIG. 7X, an opening 110OP may be formed in the protective insulating layer 110 to expose the pad 120, thus forming a protective insulating layer 110.

Referring to FIG. 7Y, the first bump 180 may be formed on the pad 120. For example, the first bump 180 may be formed by placing a solder ball on the pad 120 and reflowing the solder ball. Thereafter, the protective insulating layer 110, the fourth insulating layer IL1, the first insulating layer IL2, the redistribution structure RDS, and the molding 170 may be cut in a vertical direction to separate the semiconductor chips 150 from each other, and the support 102 may be separated from the molding 170. Therefore, the semiconductor package 100 illustrated in FIG. 1 may be manufactured. The semiconductor package 100a illustrated in FIG. 4 may be manufactured by removing the protective insulating layer 110 after or during the removing of the carrier 101 from the protective insulating layer 110. The semiconductor package 100b illustrated in FIG. 5 may be manufactured by increasing the first opening OP1 of the fourth insulating layer IL1 by etching a portion of the fourth insulating layer IL1 between the operation illustrated in FIG. 7X and the operation illustrated in FIG. 7Y.

According to the method of manufacturing a semiconductor package according to an embodiment of the inventive concepts, the insulating layer IL1 may be formed having the first opening OP1, the pad 120 may be formed having a lower portion in the first opening OP1 of the fourth insulating layer IL1 and an upper portion on the fourth insulating layer IL1, the first insulating layer IL2 may be formed covering the fourth insulating layer IL1 and the upper portion of the pad 120, the redistribution structure RDS may be formed on the first insulating layer IL2, the semiconductor chip 150 may be attached to the redistribution structure RDS, and the first bump 180 may be attached to the pad 120. Because the lower portion of the pad 120 is located in the first opening OP1 of the fourth insulating layer IL1, the undulations of the upper surface of the first insulating layer IL2 are influenced only by a thickness of the upper portion of the pad 120 and thus may be reduced compared to when the undulations of the upper surface of the first insulating layer IL2 are influenced by the total thickness of the pad 120. Therefore, even when the pad 120 is formed having a large total thickness H3 (see FIG. 2A), the undulations of the upper surface of the first insulating layer IL2 may not be significantly deteriorated. Therefore, a defective redistribution structure RDS may be prevented from being manufactured on the first insulating layer IL2 due to a reduction in a depth-of-focus (DOF) margin in the exposure process due to the undulations of the upper surface of the first insulating layer IL2, and an increase in a rate of manufacturing a defective semiconductor package may be prevented.

When the total thickness H3 (see FIG. 2A) of the pad 120 is increased, a proportion of a portion of the pad 120 forming the intermetallic compound decreases although a brittle intermetallic compound is formed between the pad 120 and the first bump 180, thereby improving the reliability of the semiconductor package. Therefore, according to the above manufacturing method, a semiconductor package with higher reliability may be manufactured without significantly increasing a rate of manufacturing defective semiconductor packages.

While the inventive concepts have been particularly shown and described with reference to embodiments thereof, it will be understood that various changes in form and details may be made therein without departing from the spirit and scope of the following claims.

What is claimed is:

1. A method of manufacturing a semiconductor package, the method comprising:
forming a first insulating layer, the first insulating layer having a first opening;
forming a pad having an upper portion and a lower portion, the upper portion of the pad being located on the first insulating layer and the lower portion of the pad being located in the first opening;
forming a second insulating layer on the first insulating layer and the pad;
forming a redistribution structure on the second insulating layer;
attaching a semiconductor chip on the redistribution structure; and
forming a bump contacting a lower surface of the lower portion of the pad;
wherein the upper portion having a greater horizontal maximum length than the lower portion, and
wherein a lower surface of the first insulating layer and the lower surface of the lower portion of the pad are coplanar.

2. The method as claimed in claim 1, further comprising forming a protective insulating layer before forming the first insulating layer,
wherein the first insulating layer is formed on the protective insulating layer.

3. The method as claimed in claim 2, further comprising forming a second opening in the protective insulating layer;
wherein a portion of the bump is located in the second opening.

4. The method as claimed in claim 2, wherein forming the pad includes:
forming a seed layer on the first insulating layer, the seed layer being formed conformally on the protective insulating layer, a side surface of the first opening of the first insulating layer, and an upper surface of the first insulating layer;
forming a photoresist layer on the seed layer having a third opening;
forming a filling layer on the seed layer to fill the third opening of the photoresist layer;
removing the photoresist layer; and
etching the seed layer using the filling layer as an etching mask.

5. The method as claimed in claim 1, wherein the second insulating layer is in contact with an upper surface and a side surface of the upper portion of the pad.

6. The method as claimed in claim 1, wherein a lower surface of the second insulating layer and a lower surface of the upper portion of the pad are coplanar.

7. The method as claimed in claim 1, wherein the first insulating layer contacts a lower surface of the upper portion of the pad and a side surface of the lower portion of the pad.

8. The method as claimed in claim 1, wherein the first insulating layer is spaced apart from a side surface of the lower portion of the pad.

9. The method as claimed in claim 1, wherein a planar area of the redistribution structure is greater than a planar area of the semiconductor chip.

10. The method as claimed in claim 1, wherein the upper portion of the pad and the lower portion of the pad share a common central axis.

11. A method of manufacturing a semiconductor package, the method comprising:
forming a protective insulating layer;
forming a first insulating layer having a first opening on the protective insulating layer;
forming a pad having an upper portion and a lower portion, the upper portion of the pad being located on the first insulating layer and the lower portion of the pad being located in the first opening, and the upper portion having a greater horizontal maximum length than the lower portion;
forming a second insulating layer on the first insulating layer and the pad;
forming a first conductive pattern on the second insulating layer and the pad, the first conductive pattern including a first line portion and a first via portion protruding downward from the first line portion, the first via contacting the pad;
forming a third insulating layer on the second insulating layer and the first conductive pattern;
forming a second conductive pattern on the third insulating layer, the second conductive pattern including a second line portion and a second via portion protruding downward from the second line portion, the second via portion contacting the first line portion of the first conductive pattern;
attaching a semiconductor chip electrically connected to the second conductive pattern on third insulating layer and the second conductive pattern;
forming a second opening in the protective insulating layer; and
forming a bump, a portion of the bump being located in the second opening;
wherein a lower surface of the first insulating layer and a lower surface of the lower portion of the pad are coplanar.

12. The method as claimed in claim 11, wherein forming the pad includes:
forming a seed layer conformally on the protective insulating layer, a side surface of the first opening of the first insulating layer, and an upper surface of the first insulating layer;
forming a photoresist layer on the seed layer having a third opening;
forming a filling layer on the seed layer to fill the third opening of the photoresist layer;
removing the photoresist layer; and
etching the seed layer using the filling layer as an etching mask.

13. The method as claimed in claim 11, wherein the bump is in contact with the lower surface of the lower portion of the pad and spaced apart from a side surface of the lower portion of the pad.

14. The method as claimed in claim 11, wherein the protective insulating layer is spaced apart from a side surface of the lower portion of the pad.

15. The method as claimed in claim 14, further comprising:
etching a portion of the first insulating layer to increase the first opening of the first insulating layer.

16. The method as claimed in claim 15, wherein the bump is in contact with the lower surface and the side surface of the lower portion of the pad.

17. The method as claimed in claim 15, wherein the bump is in contact with a lower surface of the upper portion of the pad.

18. A method of manufacturing a semiconductor package, the method comprising:
forming a protective insulating layer;
forming a first insulating layer having a first opening on the protective insulating layer;
forming a pad having an upper portion and a lower portion, the upper portion of the pad being located on the first insulating layer and the lower portion of the pad being located in the first opening;
forming a second insulating layer on the first insulating layer and the pad;
forming a redistribution structure on the second insulating layer;
attaching a semiconductor chip on the redistribution structure;
forming a second opening in the protective insulating layer;
etching a portion of the first insulating layer to increase the first opening of the first insulating layer; and
forming a bump contacting a lower surface the lower portion of the pad, a side surface of the lower portion of the pad, and a lower surface of the upper portion of the pad;
wherein the upper portion having a greater horizontal maximum length than the lower portion, and
wherein a lower surface of the first insulating layer and the lower surface of the lower portion of the pad are coplanar.

19. The method as claimed in claim 18, wherein forming the pad includes:
forming a seed layer on the first insulating layer, the seed layer being formed conformally on an upper surface of the protective insulating layer, a side surface of the first opening of the first insulating layer, and an upper surface of the first insulating layer;
forming a photoresist layer on the seed layer having a third opening;
forming a filling layer on the seed layer to fill the third opening of the photoresist layer;
removing the photoresist layer; and
etching the seed layer using the filling layer as an etching mask.

20. The method as claimed in claim 18, wherein the second insulating layer is in contact with an upper surface and a side surface of the upper portion of the pad, and
a lower surface of the second insulating layer and the lower surface of the upper portion of the pad are coplanar.

\* \* \* \* \*